(12) United States Patent
Yoshida et al.

(10) Patent No.: US 9,023,692 B2
(45) Date of Patent: May 5, 2015

(54) SEMICONDUCTOR DEVICE AND SEMICONDUCTOR DEVICE MANUFACTURING METHOD

(71) Applicant: Fuji Electric Co., Ltd., Kawasaki (JP)

(72) Inventors: Souichi Yoshida, Matsumoto (JP);
Toshihito Kamei, Kumagaya (JP); Seiji Noguchi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 75 days.

(21) Appl. No.: 14/025,321

(22) Filed: Sep. 12, 2013

(65) Prior Publication Data
US 2014/0070270 A1    Mar. 13, 2014

(30) Foreign Application Priority Data

Sep. 12, 2012  (JP) ................................. 2012-201030

(51) Int. Cl.
| | |
|---|---|
| *H01L 21/332* | (2006.01) |
| *H01L 29/02* | (2006.01) |
| *H01L 29/739* | (2006.01) |
| *H01L 29/66* | (2006.01) |
| *H01L 29/861* | (2006.01) |
| *H01L 29/06* | (2006.01) |

(52) U.S. Cl.
CPC ...... *H01L 29/7395* (2013.01); *H01L 29/66348* (2013.01); *H01L 29/861* (2013.01); *H01L 29/66128* (2013.01); *H01L 29/7397* (2013.01); *H01L 29/8611* (2013.01); *H01L 29/0696* (2013.01)

(58) Field of Classification Search
USPC ............... 257/112, 156, 172, 342, E29.028, 257/E29.066; 438/133–141
See application file for complete search history.

(56) References Cited

U.S. PATENT DOCUMENTS

| | | | |
|---|---|---|---|
| 6,566,691 B1 * | 5/2003 | Inoue et al. .................... | 257/139 |
| 7,616,859 B2 * | 11/2009 | Tokura et al. .................. | 385/147 |
| 2007/0252195 A1 | 11/2007 | Yoshikawa et al. | |
| 2008/0048295 A1 | 2/2008 | Takahashi | |
| 2009/0001411 A1 | 1/2009 | Tokura et al. | |
| 2012/0241814 A1 * | 9/2012 | Kamata et al. ................. | 257/139 |

FOREIGN PATENT DOCUMENTS

| | | |
|---|---|---|
| JP | 2007-221012 A | 8/2007 |
| JP | 2008-034794 A | 2/2008 |

(Continued)

*Primary Examiner* — Calvin Lee
(74) *Attorney, Agent, or Firm* — Rossi, Kimms & McDowell LLP

(57) ABSTRACT

IGBT and diode are formed with optimal electrical characteristics on the same semiconductor substrate. IGBT region and FWD region are provided on the same semiconductor substrate. There are a plurality of trenches at predetermined intervals in the front surface of an n⁻ type semiconductor substrate, and P-type channel regions at predetermined intervals in the longitudinal direction of the trench between neighboring trenches, thereby configuring a MOS gate. The p-type channel region and n⁻ type drift region are alternately disposed in longitudinal direction of the trench in the IGBT region. The p-type channel region and a p⁻ type spacer region are alternately disposed in the longitudinal direction of the trench in the FWD region. Pitch in longitudinal direction of the trench of p-type channel region in the IGBT region is shorter than pitch in longitudinal direction of the trench of p-type channel region in the FWD region.

12 Claims, 25 Drawing Sheets

(56) References Cited

FOREIGN PATENT DOCUMENTS

| JP | 2008-053648 A | 3/2008 |
| JP | 2009-021557 A | 1/2009 |
| JP | 2009-170670 A | 7/2009 |

* cited by examiner

US 9,023,692 B2

SEMICONDUCTOR DEVICE AND SEMICONDUCTOR DEVICE MANUFACTURING METHOD

BACKGROUND OF THE INVENTION

A. Field of the Invention

The present invention relates to a semiconductor device and semiconductor device manufacturing method.

B. Description of the Related Art

In recent years, in response to demands for a reduction in size and improvement in performance of power source instruments in the field of power electronics, efforts have been concentrated on improving performance with respect to increasing breakdown voltage, increasing current, reducing loss, increasing damage resistance, and increasing speed in power semiconductor devices. Further, a vertical MOS power device driven by a MOS gate (an insulated gate formed of a metal-oxide film-semiconductor) has been proposed as a power semiconductor device such that an increase in current and a reduction in loss are possible.

Two kinds of structure, a planar gate structure wherein a MOS gate is provided in a plate form on a semiconductor substrate and a trench gate structure wherein a MOS gate is embedded inside a trench formed in a semiconductor substrate, are widely known as MOS gate structures of this MOS power device. For recent vertical power devices, attention is being focused on the trench gate structure, as it is structurally easy to obtain low on-state resistance characteristics.

A device has been proposed as a vertical MOS power device with a trench gate structure in which a p-type channel region and n-type semiconductor substrate are disposed so that the surfaces thereof are alternately exposed in a longitudinal direction between parallel trenches, and the surface form of an n+ type emitter region selectively formed in a surface layer of the p-type channel region is wide on the trench side and narrower on a central side between the trenches (for example, refer to JP-A-2008-034794).

Also, a device has been proposed as a vertical MOS power device with a trench gate structure in which differing first conductivity type semiconductor regions separated between first conductivity type base regions formed between parallel grooves, in contact at a side surface with both of neighboring parallel grooves and positioned between the same parallel grooves, are disposed with priority between parallel grooves near a peripheral structural portion, and are in conductive contact with an emitter electrode film (for example, refer to JP-A-2007-221012).

An example of a structure of the vertical MOS power devices with trench gate structures disclosed in JP-A-2008-034794 and JP-A-2007-221012 is shown in FIGS. 26 and 27. FIG. 26 is a sectional view showing a configuration of a heretofore known vertical semiconductor device with a trench gate structure. FIG. 27 is a plan view showing an enlargement of a planar structure of a cell portion of the vertical semiconductor device of FIG. 26. FIGS. 26 and 27 each are a vertical semiconductor device with a trench gate structure shown in FIGS. 9 and 13 of JP-A-2008-034794. A cell portion is an element portion that is a smallest functional unit.

As shown in FIGS. 26 and 27, trenches 102 are provided at predetermined intervals in the front surface of an n⁻ type semiconductor substrate forming n⁻ type drift region 101 in the heretofore known vertical semiconductor device with a trench gate structure. Trenches 102 are disposed in a stripe form extending in a direction (hereafter referred to as the longitudinal direction) perpendicular to the direction (hereafter referred to as the lateral direction) in which trenches 102 are aligned. A MOS gate formed of gate dielectric 103 and gate electrode 104 is embedded inside trench 102.

P-type channel regions 105 are selectively (hereafter taken to be an insular form) disposed in the longitudinal direction of trench 102 between neighboring trenches 102. Because of this, p-type channel region 105 and n⁻ type drift region 101 are alternately exposed on the front surface of the n⁻ type semiconductor substrate. N⁺ type emitter region 106 and p⁺ type body region 107 are selectively provided inside p-type channel region 105.

Emitter electrode 109 is in contact with n⁺ type emitter region 106 and p⁺ type body region 107 via a contact hole (not shown). N⁺ type buffer layer 110 and p⁺ type collector layer 111 are provided on the back surface of the n-type semiconductor substrate. Collector electrode 113 is in contact with p⁺ type collector layer 111. An IGBT with this kind of structure is such that it is possible to realize an increase in turn-off resistance and an increase in current density.

A reverse conducting IGBT (RC-IGBT) formed of an insulated gate bipolar transistor (IGBT) and freewheeling diode (FWD) formed on the same semiconductor substrate is publicly known as a power semiconductor device used at a high current density. A device has been proposed as a heretofore known RC-IGBT whose base layer is divided by an insulated gate trench, and which is formed by a spacer channel IGBT, formed by a configuration of a body region connected to an emitter electrode and a floating region not connected to the emitter electrode, and a diode connected in anti-parallel to the IGBT being formed on the same semiconductor substrate, wherein an IGBT cell region is formed of a unit cell region and a boundary cell region neighboring a diode cell region, and the interval between neighboring insulated gate trenches in the boundary cell region is short in comparison with the interval between insulated gate trenches configuring a floating region in a unit cell region (for example, refer to JP-A-2009-021557).

A reverse conducting semiconductor device wherein an IGBT element region and a diode element region exist together on the same semiconductor substrate, and the length by which a second trench gate electrode of the diode element region protrudes from an anode layer is greater than the length by which a first trench gate electrode of the IGBT element region protrudes from a body layer, has been proposed as another heretofore known RC-IGBT (for example, refer to JP-A-2009-170670).

The following device has been proposed as another heretofore known RC-IGBT. The structure is such that an emitter layer is provided in a first region on a first main surface side of a semiconductor substrate, while no emitter layer is provided in a second region. Also, the structure is such that a collector p-type layer is provided in the first region on a second main surface side of the semiconductor substrate, while a cathode n-type layer is provided in the second region. That is, the structure is such that an IGBT is configured in the first region, while a diode is configured in the second region. The impurity concentration of a p-type base layer of the second region is lower than the impurity concentration of a p-type base layer provided in the first region (for example, refer to JP-A-2008-053648).

The present invention is directed to overcoming or at least reducing the effects of one or more of the problems set forth above.

SUMMARY OF THE INVENTION

As a result of diligent research on the part of the inventors, it has been newly discovered that, when an RC-IGBT is fabricated by an IGBT with the kind of structure shown in FIGS. 26 and 27, wherein the p-type channel regions 105 are disposed in insular form, being formed on the same semiconductor substrate as an FWD, there is a depreciation in the electrical characteristics of the RC-IGBT, such as a decrease of in the region of 10% in the RC-IGBT element breakdown voltage.

The invention provides a semiconductor device and semiconductor device manufacturing method such that, in the case of a reverse conducting IGBT wherein an insulated gate bipolar transistor and a diode are formed on the same semiconductor substrate, the insulated gate bipolar transistor and diode both have optimal electrical characteristics.

A semiconductor device according to an aspect of the invention includes on a first conductivity type semiconductor substrate a first element region in which is provided an insulated gate bipolar transistor and a second element region in which is provided a diode, the device including a plurality of trenches provided at predetermined intervals from the first element region to the second element region in the front surface of the first conductivity type semiconductor substrate, in stripe form extending in a longitudinal direction perpendicular to the direction in which the first element region and second element region are aligned, a gate dielectric provided along the side walls and bottom surface of the trench, a gate electrode provided on the inner side of the gate dielectric inside the trench, second conductivity type channel regions provided at predetermined intervals in the longitudinal direction of the trench between neighboring trenches, a first conductivity type emitter region, selectively provided inside the second conductivity type channel region, in contact with the gate dielectric provided on the side walls of the trench, a second conductivity type spacer region with an impurity concentration lower than that of the second conductivity type channel region, disposed alternately with the second conductivity type channel region in the longitudinal direction of the trench between neighboring trenches of the second element region, a first electrode in contact with the second conductivity type channel region, first conductivity type emitter region, and second conductivity type spacer region, a second conductivity type collector layer provided on the back surface of the first conductivity type semiconductor substrate in the first element region, a first conductivity type cathode layer provided on the back surface of the first conductivity type semiconductor substrate in the second element region, and a second electrode in contact with the second conductivity type collector layer and first conductivity type cathode layer, wherein the disposition interval in the longitudinal direction of the trench of the second conductivity type channel region in the first element region is shorter than the disposition interval in the longitudinal direction of the trench of the second conductivity type channel region in the second element region.

The semiconductor device according to the heretofore described aspect of the invention is such that the second conductivity type spacer region is further provided in portions of the first element region sandwiched by the second conductivity type channel region between neighboring trenches.

The semiconductor device according to the heretofore described aspect of the invention is such that the second conductivity type spacer region of the first element region is in contact with the second conductivity type channel region neighboring in the longitudinal direction of the trench.

The semiconductor device according to the heretofore described aspect of the invention is such that the first electrode is further in contact with the second conductivity type spacer region disposed in the first element region.

The semiconductor device according to the heretofore described aspect of the invention may further include a first conductivity type semiconductor region provided between the second conductivity type spacer region of the first element region and the second conductivity type channel region neighboring the second conductivity type spacer region in the longitudinal direction of the trench.

The semiconductor device according to the heretofore described aspect of the invention may further include an interlayer dielectric covering the front surface of the first conductivity type semiconductor substrate, and contact holes selectively opened in the interlayer dielectric so that portions of the second conductivity type channel region, first conductivity type emitter region, and second conductivity type spacer region in contact with the first electrode are exposed, wherein the contact holes formed in the second element region expose the second conductivity type channel region and second conductivity type spacer region alternately along the trench in the longitudinal direction of the trench.

The invention provides a method of manufacturing a semiconductor device including on a first conductivity type semiconductor substrate a first element region in which is provided an insulated gate bipolar transistor and a second element region in which is provided a diode, the method including a step of forming a plurality of trenches provided at predetermined intervals from the first element region to the second element region in the front surface of the first conductivity type semiconductor substrate, in stripe form extending in a longitudinal direction perpendicular to the direction in which the first element region and second element region are aligned, a step of forming a gate electrode across a gate dielectric inside the trench, a step of forming a second conductivity type spacer region at least between neighboring trenches of the second element region, and a step of selectively forming second conductivity type channel regions with an impurity concentration higher than that of the second conductivity type spacer region at predetermined intervals in the longitudinal direction of the trench between neighboring trenches, wherein the second conductivity type channel region formed inside the second conductivity type spacer region is disposed alternately with the second conductivity type spacer region in the longitudinal direction of the trench, and the disposition interval in the longitudinal direction of the trench of the second conductivity type channel region in the first element region is shorter than the disposition interval in the longitudinal direction of the trench of the second conductivity type channel region in the second element region.

The manufacturing method according to the heretofore described aspect of the invention is such that the second conductivity type spacer region is formed only in the second element region.

The manufacturing method according to the heretofore described aspect of the invention is such that the second conductivity type spacer region is formed in the first element region and second element region.

The manufacturing method according to the heretofore described aspect of the invention is such that the second conductivity type channel region is formed in contact with the second conductivity type spacer region.

The manufacturing method according to the heretofore described aspect of the invention is such that the second conductivity type channel region and second conductivity type spacer region are disposed separated in the first element region, and a first conductivity type semiconductor region is formed between the second conductivity type channel region and second conductivity type spacer region.

The manufacturing method according to the heretofore described aspect of the invention may further include a step of selectively forming a first conductivity type emitter region inside the second conductivity type channel region, a step of covering the front surface of the first conductivity type semiconductor substrate with an interlayer dielectric, a step of forming contact holes, selectively opened in the interlayer dielectric, in which the second conductivity type channel region, first conductivity type emitter region, and second conductivity type spacer region are selectively exposed, and a step of forming a first electrode in contact with the second conductivity type channel region, first conductivity type emitter region, and second conductivity type spacer region via the contact holes, wherein the contact holes formed in the second element region are formed so that the second conductivity type channel region and second conductivity type spacer region are exposed alternately along the trench in the longitudinal direction of the trench.

According to the invention, it is possible to suppress an implantation of carriers when an FWD is operating by p⁻ type spacer regions being provided in an FWD region (the second element region), and by there being less p-type channel regions in the FWD region than in an IGBT region (the first element region). Because of this, an RC-IGBT wherein an insulated gate bipolar transistor (IGBT) and freewheeling diode (FWD) are formed on the same n⁻ type semiconductor substrate is such that it is possible to reduce recovery loss when the FWD is operating. Also, by there being more p-type channel regions in the IGBT region than in the FWD region, it is possible to increase the IGBT channel density, and thus possible to reduce IGBT power loss (DC loss).

Also, according to the invention, it is possible, by a trench gate being provided in the FWD region, to prevent a decrease in breakdown voltage in the vicinity of the boundary between the IGBT region and FWD region, and thus possible to ensure the breakdown voltage of the whole RC-IGBT. Also, by providing a MOS gate in the FWD region, it is possible to suppress a decrease in the channel density of the IGBT region, and thus possible to suppress a depreciation in the on-state voltage of the IGBT caused by the FWD being formed on the same n⁻ type semiconductor substrate.

According to the semiconductor device and semiconductor device manufacturing method according to the invention, an advantage is achieved in the case of a reverse conducting IGBT wherein an insulated gate bipolar transistor and a diode are formed on the same semiconductor substrate in that it is possible for the electrical characteristics of both the insulated gate bipolar transistor and diode to be in an optimal condition.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereafter, with reference to the attached drawings, a detailed description will be given of preferred embodiments of a semiconductor device and semiconductor device manufacturing method according to the invention. In the specification and attached drawings, a layer or region being prefixed by n or p indicates that electrons or holes respectively are majority carriers. Also, superscript + or − being added to n or p indicates a higher impurity concentration or lower impurity concentration respectively than in a layer or region to which neither is added. The same reference signs are given to the same configurations in the following embodiments and attached drawings, and redundant descriptions will be omitted.

Embodiment 1

Figure 1:
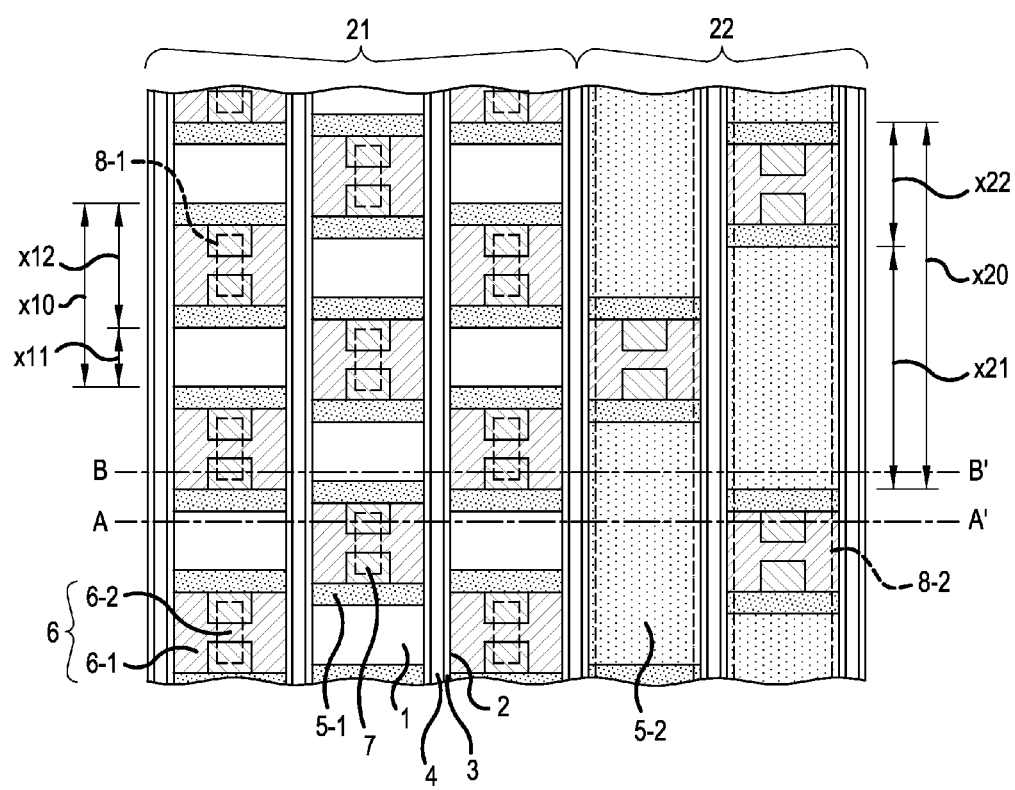
FIG. 1 is a plan view showing a configuration of a semiconductor device according to Embodiment 1.
Figure 2:
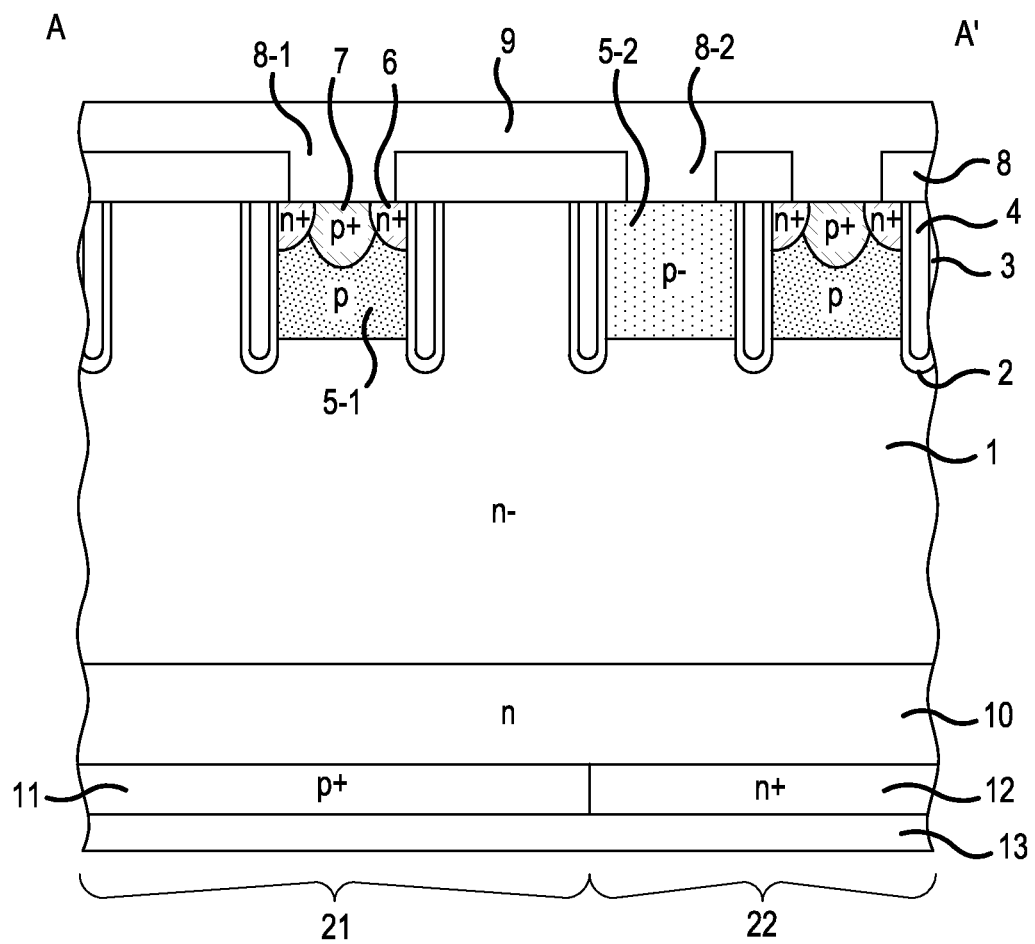
FIG. 2 is a sectional view showing a sectional structure along a cut line A-A' of FIG. 1.
Figure 3:
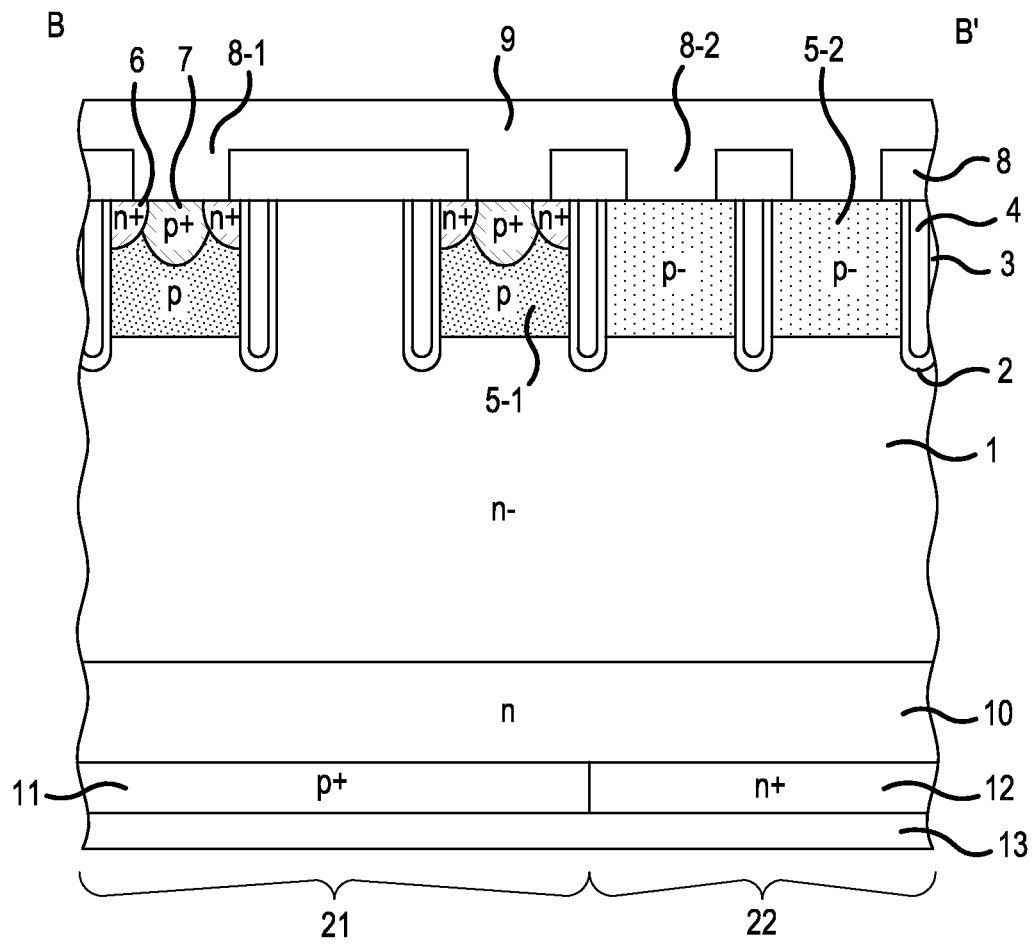
FIG. 3 is a sectional view showing a sectional structure along a cut line B-B' of FIG. 1.

A description will be given of a semiconductor device according to Embodiment 1. FIG. 1 is a plan view showing a configuration of the semiconductor device according to Embodiment 1. FIG. 2 is a sectional view showing a sectional structure along a cut line A-A' of FIG. 1. FIG. 3 is a sectional view showing a sectional structure along a cut line B-B' of FIG. 1. As shown in FIGS. 1 to 3, the semiconductor device according to Embodiment 1 includes, on the same $n^-$ type semiconductor substrate, forming $n^-$ type drift region 1, IGBT region (first element region) 21, in which is provided an insulated gate bipolar transistor (IGBT), and FWD region (second element region) 22, in which is provided a freewheeling diode (FWD).

The FWD of FWD region 22 is connected in anti-parallel to the IGBT of IGBT region 21. That is, the semiconductor device according to Embodiment 1 is a reverse conducting IGBT (RC-IGBT). Trenches 2 are provided at predetermined intervals in the front surface of the $n^-$ type semiconductor substrate from IGBT region 21 to FWD region 22. Trenches 2 are disposed in stripe form extending in a direction (longitudinal direction) perpendicular to the direction (lateral direction) in which IGBT region 21 and FWD region 22 are aligned. Gate dielectric 3 is provided along the inner walls of trench 2 inside trench 2. Also, gate electrode 4 is provided on the inner side of gate dielectric 3 inside trench 2.

P-type channel regions 5-1 are selectively provided to a depth less than that of trench 2 in a surface layer of the front surface of the $n^-$ type semiconductor substrate between neighboring trenches 2. P-type channel regions 5-1 are selectively (hereafter taken to be an insular form) disposed at predetermined intervals x11 and x21 in the longitudinal direction of trench 2. A first pitch (disposition interval) x11 of p-type channel regions 5-1 in the longitudinal direction of trench 2 in IGBT region 21 is shorter than a second pitch x21 of p-type channel regions 5-1 in the longitudinal direction of trench 2 in FWD region 22 (x11<x21). That is, there are more p-type channel regions 5-1 disposed in IGBT region 21 than in FWD region 22. Because of this, it is possible to increase the channel density in IGBT region 21, and on-state voltage (Von) characteristics approximately the same as those of a single IGBT are obtained.

P-type channel regions 5-1 and $n^-$ type drift region 1 are alternately exposed in the longitudinal direction of trench 2 on the front surface of $n^-$ type semiconductor substrate in IGBT region 21. A width x12 of p-type channel regions 5-1 in the longitudinal direction of trench 2 in IGBT region 21 is greater than the width in the longitudinal direction of trench 2 of a portion of $n^-$ type drift region 1 sandwiched by p-type channel regions 5-1, that is, the first pitch x11 (x12>x11). The width x12 of p-type channel regions 5-1 in the longitudinal direction of trench 2 in IGBT region 21 is equivalent to a width x22 of p-type channel regions 5-1 in the longitudinal direction of trench 2 in FWD region 22 (x12=x22).

Meanwhile, $p^-$ type spacer regions 5-2 are selectively provided to a depth less than that of trench 2 between p-type channel regions 5-1 adjacent in the longitudinal direction of trench 2 in FWD region 22. That is, p-type channel regions 5-1 and $p^-$ type spacer regions 5-2 are alternately exposed in the longitudinal direction of trench 2 in the front surface of the $n^-$ type semiconductor substrate in FWD region 22. The $p^-$ type spacer regions 5-2 are in contact with p-type channel regions 5-1. It is preferable that the width (second pitch x21) of the $p^-$ type spacer region 5-2 in the longitudinal direction of trench 2 in FWD region 22 is greater than the width x22 in the longitudinal direction of trench 2 of the p-type channel region 5-1. The reason for this is that it is possible to more quickly draw out holes at a time of FWD reverse recovery, and the like.

An $n^+$ type emitter region 6 and $p^+$ type body region 7 are selectively provided inside the p-type channel region 5-1 in both IGBT region 21 and FWD region 22. $N^+$ type emitter region 6 opposes gate electrode 4 across gate dielectric 3 provided on the side walls of trench 2. $N^+$ type emitter region 6 is formed of, for example, two first $n^+$ type regions 6-1 provided on trench 2 side and second $n^+$ type region 6-2, provided in a central portion of p-type channel region 5-1, linking the two first $n^+$ type regions 6-1. The width in the longitudinal direction of trench 2 of second $n^+$ type region 6-2 is less than the width in the longitudinal direction of trench 2 of first $n^+$ type region 6-1. $N^+$ type emitter region 6 may be configured of only the two first $n^+$ type regions 6-1. $P^+$ type body region 7 is provided in a central portion of p-type channel region 5-1, and is in contact with $n^+$ type emitter region 6.

In this way, trench gate type MOS gates (insulated gates formed of a metal-oxide film-semiconductor) formed of trench 2, gate dielectric 3, gate electrode 4, p-channel region 5-1, $n^+$ type emitter region 6, and $p^+$ type body region 7 are provided in each of IGBT region 21 and FWD region 22. Each MOS gate of IGBT region 21 configures an IGBT (cell portion). $N^-$ type drift region 1 is exposed on the front surface of the $n^-$ type semiconductor substrate between MOS gates neighboring in the longitudinal direction of trench 2 in IGBT region 21. Meanwhile, $p^-$ type spacer region 5-2 is exposed on the front surface of the $n^-$ type semiconductor substrate between MOS gates neighboring in the longitudinal direction of trench 2 in the FWD region 22. The $p^-$ type spacer region 5-2 functions as a $p^-$ type anode region, and configures an FWD (cell portion) of FWD region 22.

Also, by arranging so that the first pitch x11 is smaller than the second pitch x21 (x11<x21), and disposing p-type channel regions 5-1 so that there are more in IGBT region 21 than in FWD region 22, as heretofore described, the lowness of the ratio occupied by the MOS gates between neighboring trenches 2 (the spacing rate) can be greater in FWD region 22 than in IGBT region 21. The spacing rate in IGBT region 21 is the ratio between the surface area occupied by $n^-$ type drift region 1 sandwiched between one MOS gate and another MOS gate neighboring the MOS gate and the surface area occupied by the relevant MOS gates. Specifically, the spacing rate in IGBT region 21 is the ratio between the first pitch x11 and a total length (hereafter referred to as a first cell pitch) x10 of the width x12 in the longitudinal direction of trench 2 of p-type channel region 5-1 and the first pitch x11 (=first pitch x11/first cell pitch x10).

The spacing rate in FWD region 22 is the ratio between the surface area occupied by one MOS gate and one $p^-$ type spacer region 5-2 neighboring the MOS gate in the longitudinal direction of trench 2 and the surface area occupied by the relevant MOS gate. Specifically, the spacing rate in FWD region 22 is the ratio between the second pitch x21 and a total length (hereafter referred to as a second cell pitch) x20 of the width x22 in the longitudinal direction of trench 2 of p-type channel region 5-1 and the second pitch x21 (=second pitch x21/second cell pitch x20).

Interlayer dielectric 8 having a plurality of contact holes is provided on the front surface of the n⁻ type semiconductor substrate. First contact hole 8-1 is provided for each cell portion in IGBT region 21. Further, n⁺ type emitter region 6 and p⁺ type body region 7 of one cell portion are exposed in one first contact hole 8-1. Meanwhile, in FWD region 22, one second contact hole 8-2 is provided in the longitudinal direction of trench 2 between each pair of neighboring trenches 2. All the MOS gates and p⁻ type spacer regions 5-2 disposed between neighboring trenches 2 are exposed in the second contact hole 8-2.

An emitter electrode (first electrode) 9 is provided from IGBT region 21 to FWD region 22, and is in contact with the n⁺ type emitter region 6 and p⁺ type body region 7 via first contact hole 8-1 and second contact hole 8-2. Also, the emitter electrode 9 doubles as an anode electrode, and is in contact with p⁻ type spacer region 5-2 in FWD region 22. Emitter electrode 9 is electrically isolated from gate electrode 4 by interlayer dielectric 8. P⁺ type collector layer 11 is selectively provided in a surface layer of the back surface of the n⁻ type semiconductor substrate in IGBT region 21. Also, n⁺ type cathode layer 12 is selectively provided in a surface layer of the back surface of the n⁻ type semiconductor substrate in FWD region 22.

N⁺ type cathode layer 12 is provided, aligned with p⁺ type collector layer 11, in a horizontal direction on the back surface of the n⁻ type semiconductor substrate. n-type buffer layer 10 is provided between p⁺ type collector layer 11 and n⁺ type cathode layer 12 and n⁻ type drift region 1. N-type buffer layer 10 has a function as an n-type field stop layer that suppresses a depletion layer spreading from the p-n junction on the front surface side of the semiconductor substrate when turning off so that the depletion layer does not reach p⁺ type collector layer 11. Collector electrode (second electrode) 13 is in contact with p⁺ type collector layer 11. Also, collector electrode 13 doubles as a cathode electrode, and is in contact with n⁺ type cathode layer 12.

Figure 4:
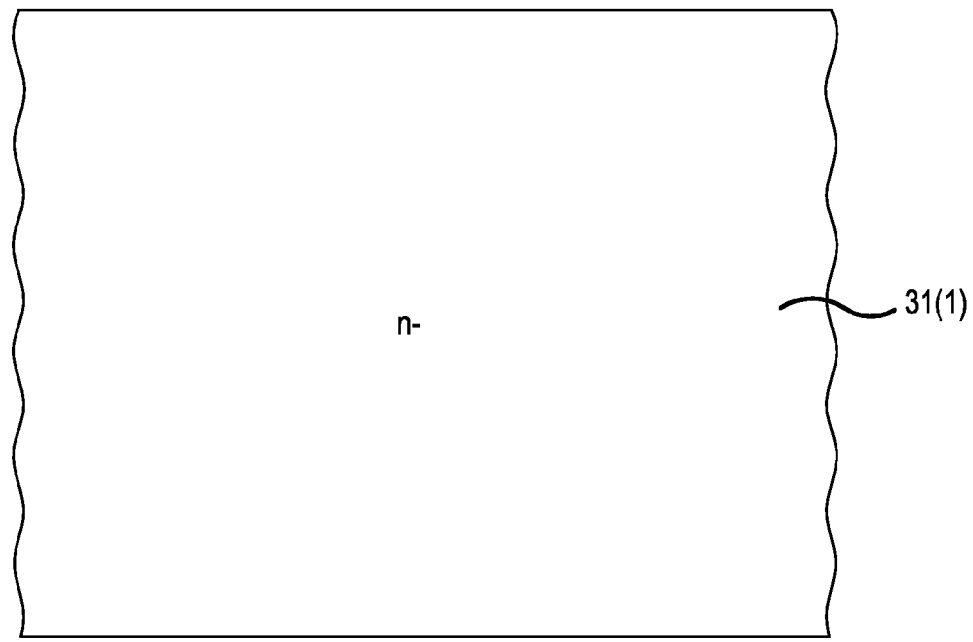
FIG. 4 is a sectional view showing a condition partway through the manufacturing of the semiconductor device according to Embodiment 1.

Next, a description will be given of a semiconductor device manufacturing method according to Embodiment 1. FIGS. 4 to 7 are sectional views showing conditions partway through the manufacturing of the semiconductor device according to Embodiment 1. FIGS. 8A to 12B are illustrations showing conditions partway through the manufacturing of the semiconductor device according to Embodiment 1. In FIGS. 8A to 12B, planar structures partway through the manufacturing are shown in FIGS. 8B, 9B, 10B, 11B, and 12B, while sectional structures along a cut line AA-AA' of FIGS. 8B, 9B, 10B, 11B, and 12B are shown in FIGS. 8A, 9A, 10A, 11A, and 12A. Firstly, there is prepared an n⁻ type silicon (Si) substrate (an n⁻ type semiconductor substrate) 31, which is to form the n⁻ type drift region 1, with, for example, a main surface plane orientation of a plane equivalent to a (100) plane and resistivity of in the region of 50 Ωcm, as shown in FIG. 4.

Next, for example, a p-type guard ring configuring a voltage withstanding structure is formed on the front surface side of the n⁻ type semiconductor substrate 31 in a termination structure portion omitted from the drawings. The termination structure portion is a region that alleviates an active region electrical field acting on n⁻ type drift region 1, thus maintaining breakdown voltage. The active region is a region in which an RC-IGBT element structure is formed. In the same way, the termination structure portion is also omitted from FIGS. 1 to 3 and FIGS. 5 to 22B. Specifically, when forming the voltage withstanding structure of the termination structure portion, firstly, a resist mask (not shown) in which is opened a p-type guard ring formation region is formed on the front surface of n⁻ type semiconductor substrate 31.

Figure 5:
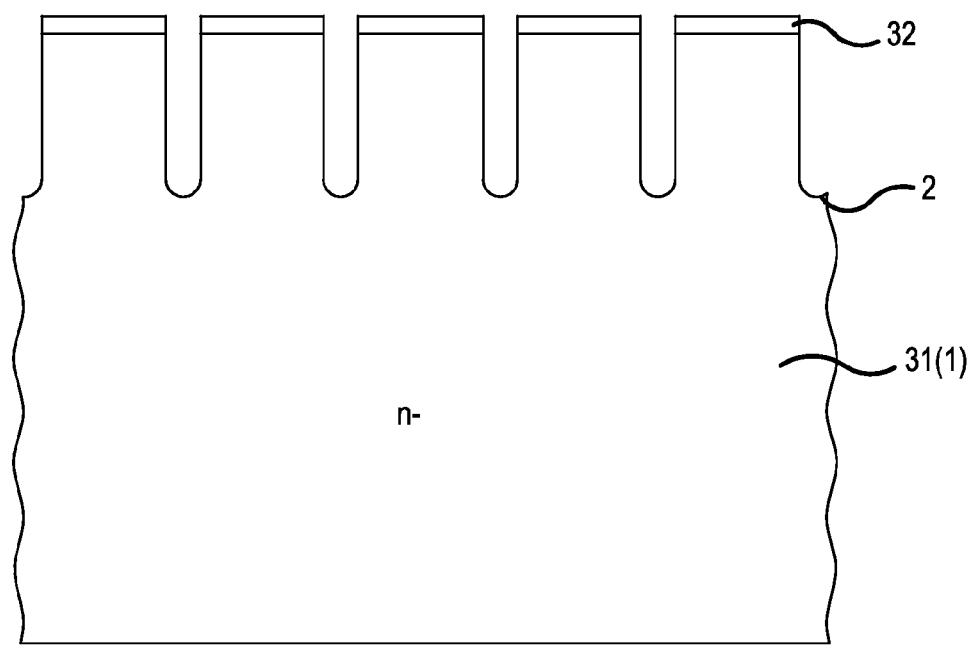
FIG. 5 is a sectional view showing a condition partway through the manufacturing of the semiconductor device according to Embodiment 1.

Next, with the resist mask as a mask, a p-type impurity such as boron (B) is ion implanted into the front surface of the n⁻ type semiconductor substrate 31. Next, after the resist mask has been removed, the p-type guard ring is formed by the p-type impurity implanted into n⁻ type semiconductor substrate 31 being diffused by a thermal diffusion process. Also, an oxide film is formed on the front surface of the n⁻ type semiconductor substrate 31 by the thermal diffusion process for forming the p-type guard ring. Next, as shown in FIG. 5, the oxide film is selectively removed by photolithography, thereby forming mask oxide film 32 in which are opened regions in which trenches 2 are formed.

Next, for example, anisotropic dry etching is carried out with mask oxide film 32 as a mask, thereby forming trenches 2 to a predetermined depth in the front surface of n⁻ type semiconductor substrate 31. Next, after a sacrificial oxide film (not shown) has been formed by sacrificial oxidation on the inner walls of trenches 2, a defect layer formed on the surface of the n⁻ type semiconductor substrate 31 by the formation of trenches 2 is removed by the sacrificial oxide film being removed. Next, all of mask oxide film 32 formed in the active region is removed.

Figure 6:
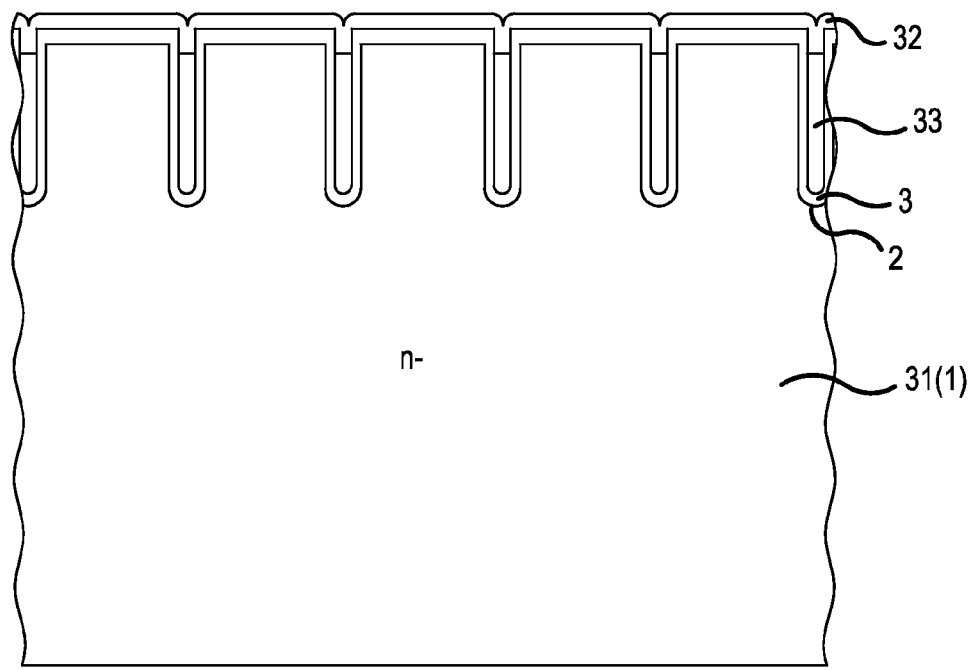
FIG. 6 is a sectional view showing a condition partway through the manufacturing of the semiconductor device according to Embodiment 1.

Next, as shown in FIG. 6, gate dielectric 3 with a thickness of, for example, 100 nm to 120 nm is formed by thermal oxidation on the front surface of n⁻ type semiconductor substrate 31 so as to follow the inner walls of trenches 2. Next, a conductive polycrystalline silicon film 33 doped with, for example, phosphorus (P) or boron is deposited to a thickness of, for example, 0.5 μm to 1.0 μm on the front surface of n⁻ type semiconductor substrate 31, filling the insides of trenches 2 with conductive polycrystalline silicon film 33. Conductive polycrystalline silicon film 33 may be formed using, for example, low pressure chemical vapor deposition (CVD) technology.

Figure 7:
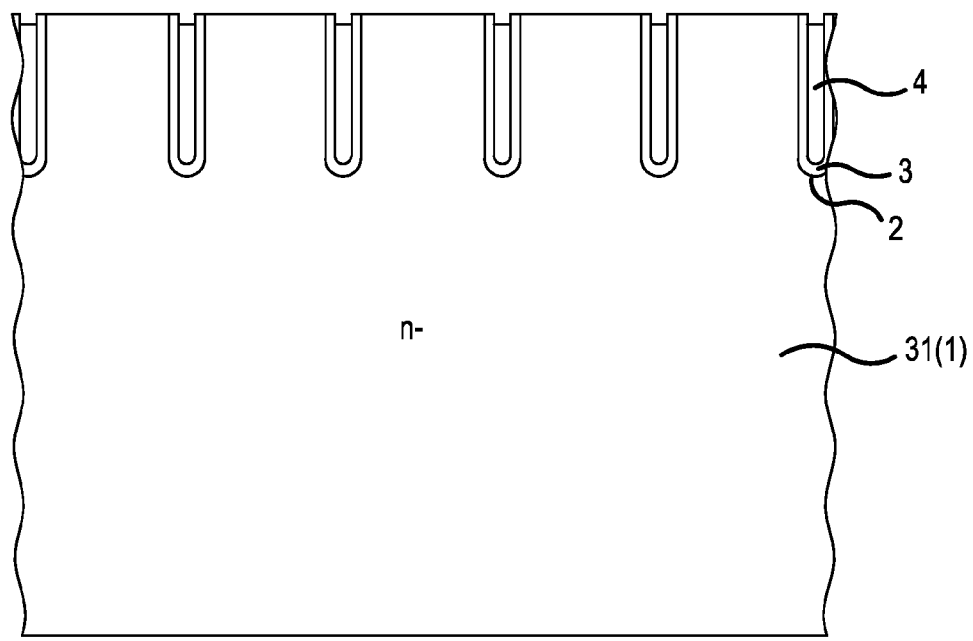
FIG. 7 is a sectional view showing a condition partway through the manufacturing of the semiconductor device according to Embodiment 1.
Figure 8:
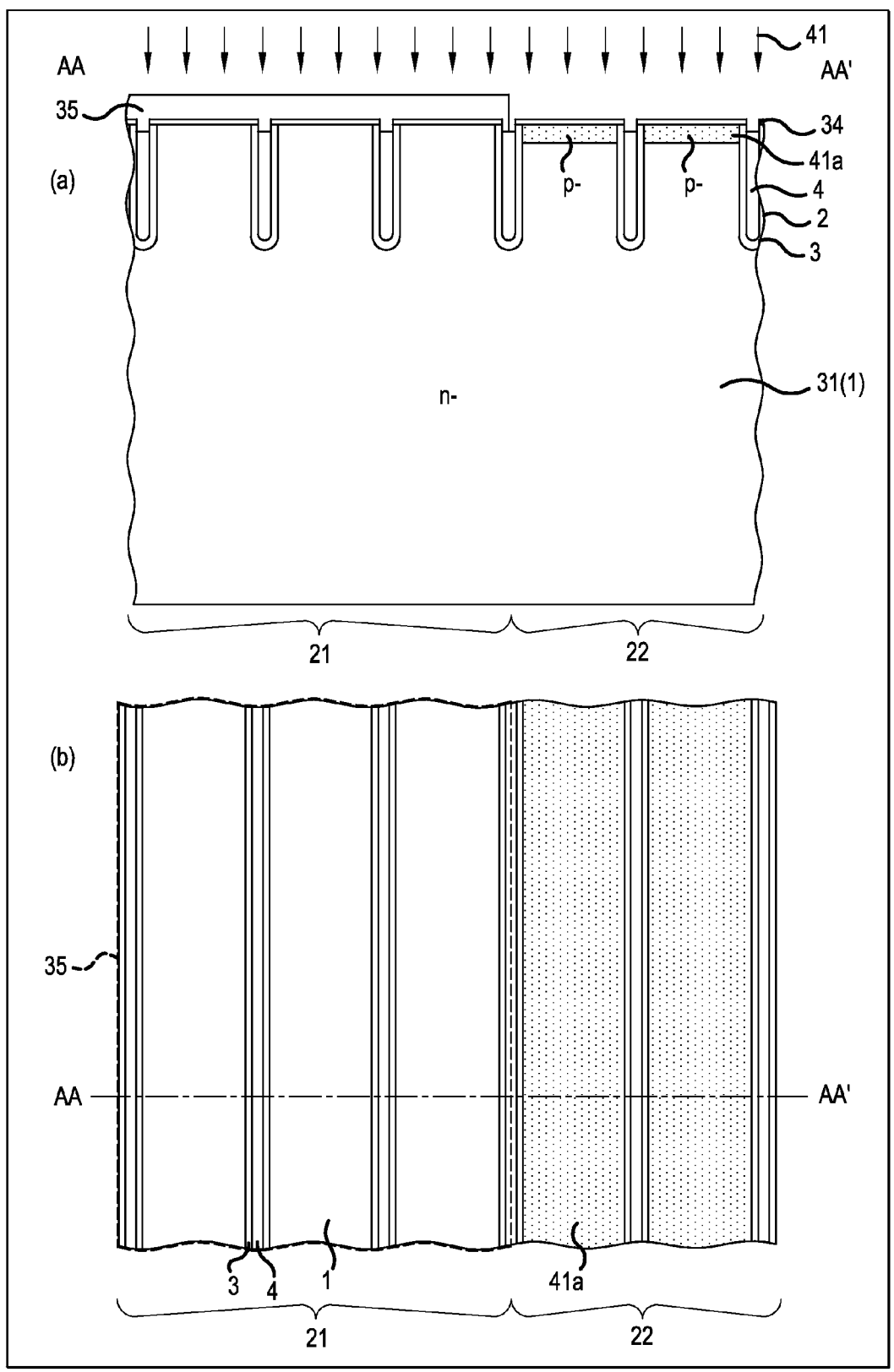
FIGS. 8A and 8B are illustrations showing a condition partway through the manufacturing of the semiconductor device according to Embodiment 1.
Figure 9:
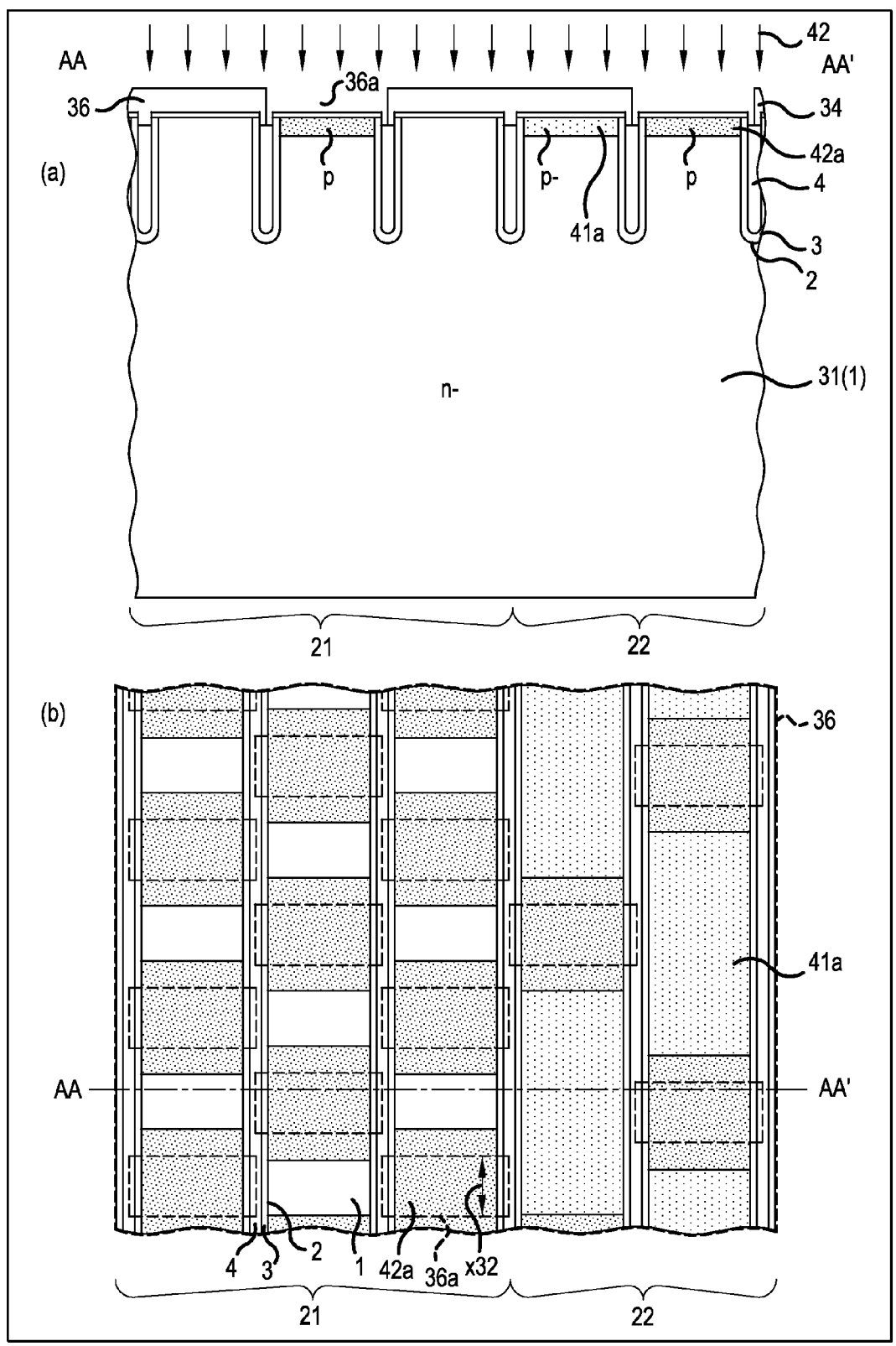
FIGS. 9A and 9B are illustrations showing a condition partway through the manufacturing of the semiconductor device according to Embodiment 1.
Figure 10:
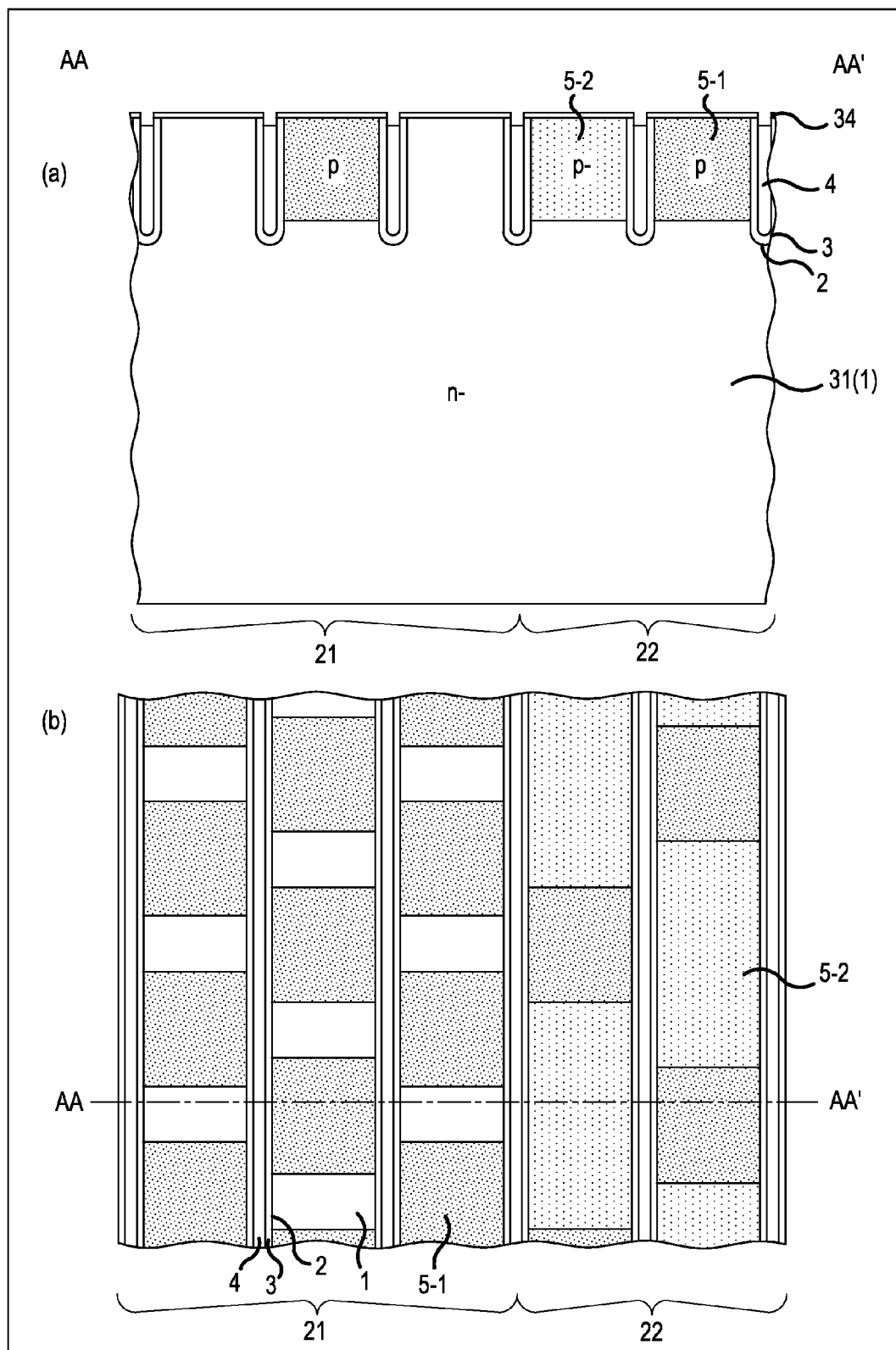
FIGS. 10A and 10B are illustrations showing a condition partway through the manufacturing of the semiconductor device according to Embodiment 1.
Figure 11:
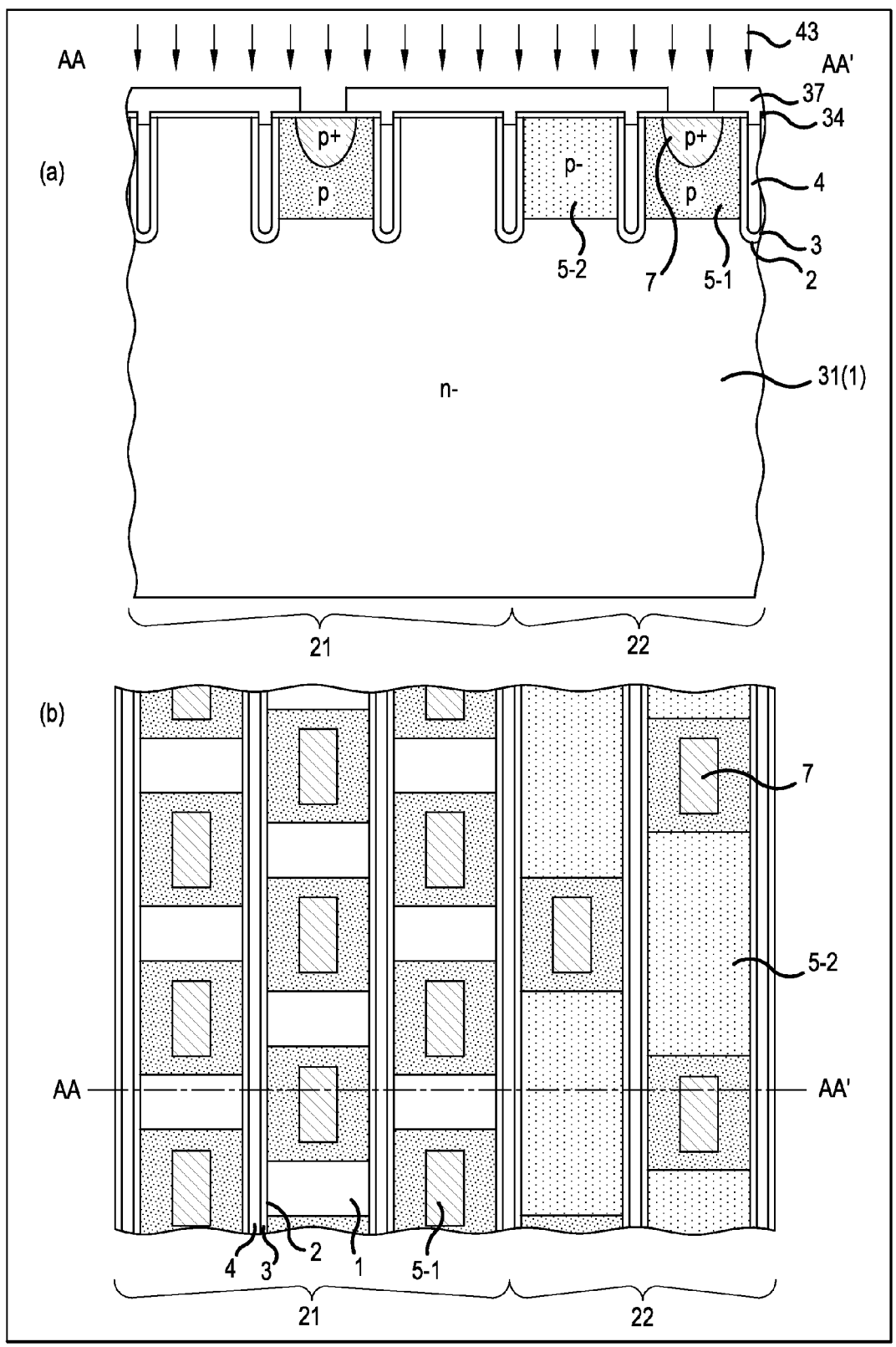
FIGS. 11A and 11B are illustrations showing a condition partway through the manufacturing of the semiconductor device according to Embodiment 1.
Figure 12:
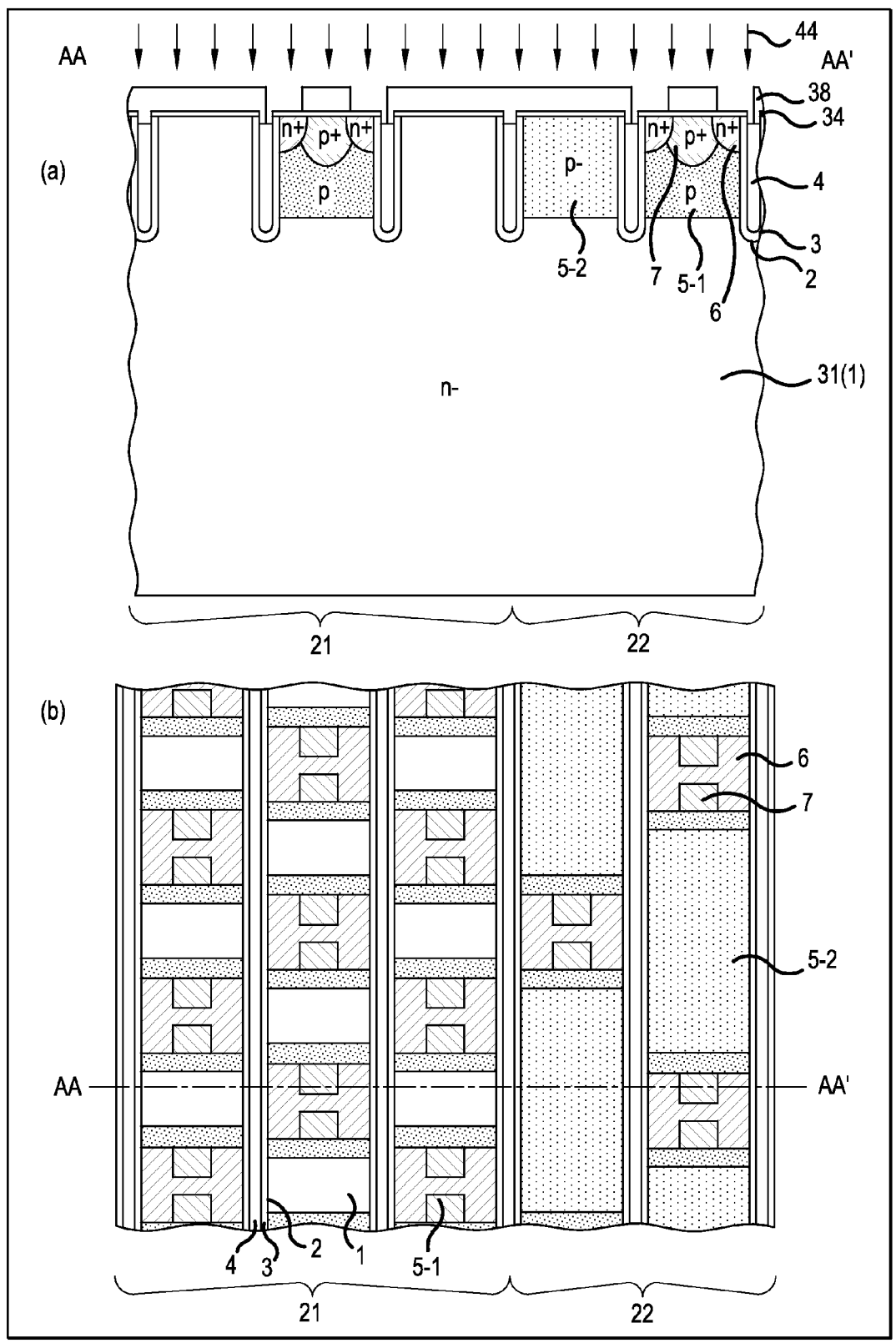
FIGS. 12A and 12B are illustrations showing a condition partway through the manufacturing of the semiconductor device according to Embodiment 1.

Next, conductive polycrystalline silicon film 33 is etched back until gate dielectric 3 on the front surface of the n⁻ type semiconductor substrate 31 is exposed, leaving conductive polycrystalline silicon film 33, which is to form gate electrode 4, only inside trenches 2. By so doing, gate electrode 4 is formed across gate dielectric 3 inside trenches 2, as shown in FIG. 7. Next, gate dielectric 3 and mask oxide film 32 on the front surface of n⁻ type semiconductor substrate 31 are removed.

Next, as shown in FIGS. 8A and 8B, screen oxide film 34 is formed by thermal oxidation technology on the front surface of n⁻ type semiconductor substrate 31. Screen oxide film 34 is omitted from FIG. 8B (the same applies to each of FIGS. 9B, 10B, 11B, and 12B). Next, resist mask 35 having an aperture portion in which is exposed p⁻ type spacer region 5-2 formation region is formed by photolithography on the front surface of n⁻ type semiconductor substrate 31, as shown in FIG. 8A. That is, FWD region 22 is exposed in the aperture portion of resist mask 35.

Next, with resist mask 35 as a mask, first ion implantation 41 of a p-type impurity such as boron is carried out through the screen oxide film 34 into the front surface of n⁻ type semiconductor substrate 31. First ion implantation 41 may be such that, for example, the dose is $1.0 \times 10^{12}/cm^2$ to $1.0 \times 10^{13}/cm^2$, while the acceleration energy is in the region of 100 keV. P⁻ type impurity region 41a is formed by first ion implantation 41 in portions of n⁻ type semiconductor substrate 31 sandwiched by trenches 2 in FWD region 22 only. Subsequently, resist mask 35 is removed.

Next, as shown in FIGS. 9A and 9B, resist mask 36 having aperture portions 36a in which is exposed p⁻ type channel region 5-1 formation region is formed by photolithography on the front surface of n⁻ type semiconductor substrate 31. Next, with resist mask 36 as a mask, second ion implantation 42 of a p-type impurity such as boron is carried out through screen oxide film 34 into the front surface of n⁻ type semiconductor substrate 31. Second ion implantation 42 may be such that, for example, the dose is in the region of $2.0 \times 10^{13}/cm^2$, while the acceleration energy is in the region of 100 keV.

P-type impurity region 42a is formed by second ion implantation 42 in n⁻ type drift region 1 of IGBT region 21 and p⁻ type impurity region 41a of FWD region 22 exposed in aperture portions 36a of resist mask 36. A width x32 in the longitudinal direction of trench 2 of aperture portion 36a of resist mask 36, taking into consideration a subsequent diffusion in a lateral direction (a direction parallel to the main surface of n⁻ type semiconductor substrate 31) of the p-type impurity using a thermal diffusion process, is set to be less than the width x12 in the longitudinal direction of trench 2 of p-type channel region 5-1. Subsequently, resist mask 36 is removed.

Next, a thermal diffusion process is carried out at a temperature of, for example, 1,100° C., thereby thermally diffusing p⁻ type impurity region 41a and p-type impurity region 42a formed in a surface layer of the front surface of n⁻ type semiconductor substrate 31 by first and second ion implantations 41 and 42, as shown in FIGS. 10A and 10B. By so doing, p-type channel region 5-1 and p⁻ type spacer region 5-2 are formed in predetermined positions in the surface layer of the front surface of n⁻ type semiconductor substrate 31. By regulating the doses of the first and second ion implantations 41 and 42 as appropriate, it is possible to regulate the threshold of the semiconductor device at room temperature (for example, 25° C.) to in the region of 6V.

Next, as shown in FIGS. 11A and 11B, resist mask 37 having aperture portions in which is exposed p⁺ type body region 7 formation region is formed by photolithography on the front surface of n⁻ type semiconductor substrate 31. Next, with resist mask 37 as a mask, third ion implantation 43 of a p-type impurity such as boron is carried out through screen oxide film 34 into the front surface of n⁻ type semiconductor substrate 31. Resist mask 37 is omitted from FIG. 11B (in the same way, a resist mask is also omitted from FIG. 12B).

Third ion implantation 43 may be such that, for example, the dose is $1.0 \times 10^{15}/cm^2$ to $5.0 \times 10^{15}/cm^2$, while the acceleration energy is in the region of 100 keV. Next, after resist mask 37 has been removed, a thermal diffusion process is carried out at a temperature of, for example, 1,000° C., thereby diffusing the p⁻ type impurity implanted into n⁻ type semiconductor substrate 31 by third ion implantation 43. By so doing, p⁺ type body region 7 is formed inside p-type channel region 5-1.

Next, as shown in FIGS. 12A and 12B, resist mask 38 having aperture portions in which is exposed n⁺ type emitter region 6 formation region is formed by photolithography on the front surface of n⁻ type semiconductor substrate 31. Next, with resist mask 38 as a mask, fourth ion implantation 44 of an n-type impurity such as arsenic (As) is carried out through screen oxide film 34 into the front surface of n⁻ type semiconductor substrate 31. Next, after resist mask 38 has been removed, a thermal diffusion process is carried out, thereby diffusing the n⁻ type impurity implanted into n⁻ type semiconductor substrate 31 by fourth ion implantation 44. By so doing, n⁺ type emitter region 6 is formed inside p-type channel region 5-1.

Next, interlayer dielectric 8, of borophosphosilicate glass (BPSG) or the like, is formed over the whole of the front surface of n⁻ type semiconductor substrate 31. Next, interlayer dielectric 8 is selectively removed by photolithography, thereby forming the first and second contact holes 8-1 and 8-2. Next, the RC-IGBT shown in FIGS. 1 to 3 is completed by emitter electrode 9 being formed on the front surface of n⁻ type semiconductor substrate 31, and n-type buffer layer 10, p⁺ type collector layer 11, n⁺ type cathode layer 12, and collector electrode 13 on the back surface side, using a general method.

Figure 13:
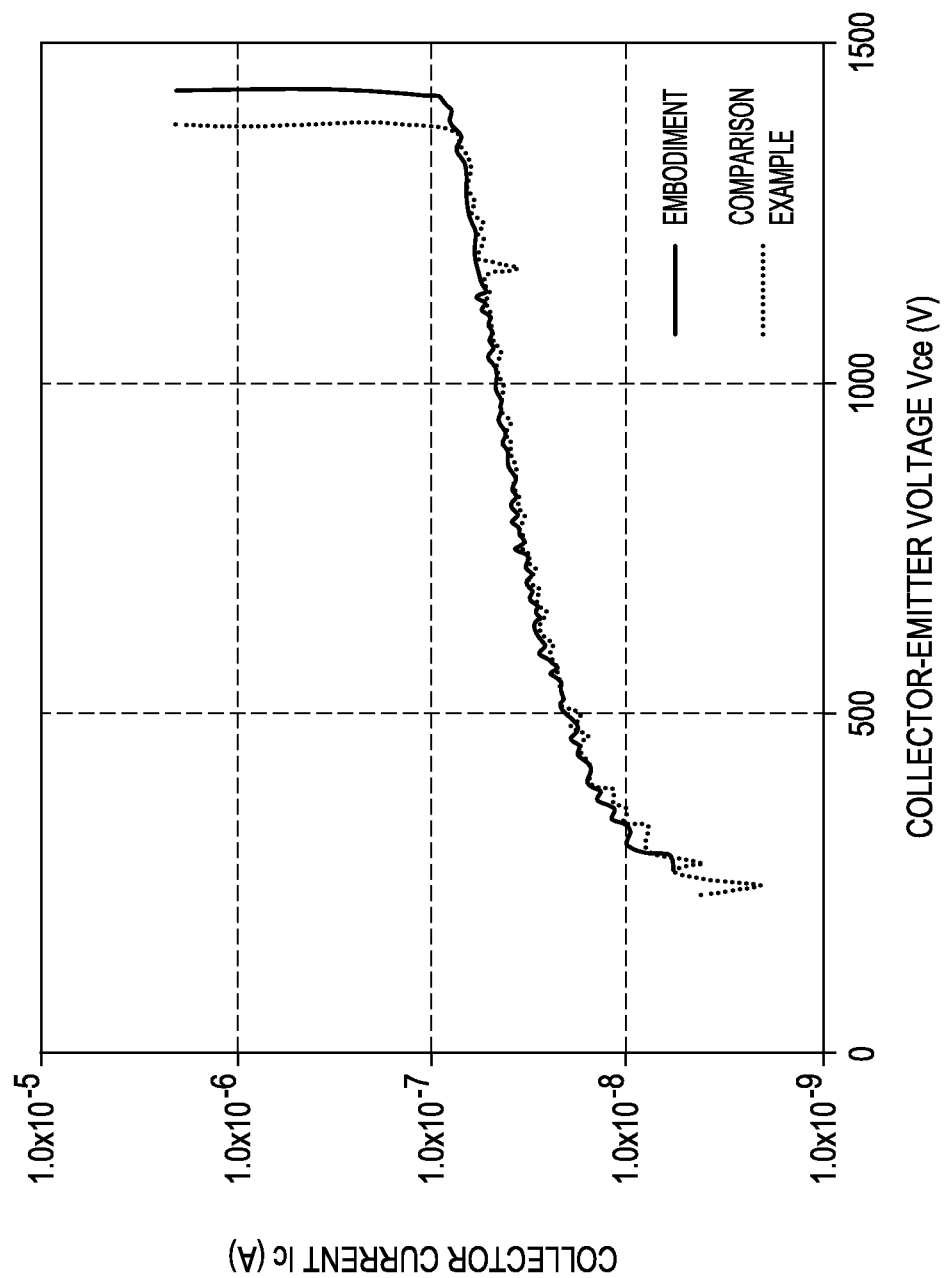
FIG. 13 is a characteristic diagram showing the breakdown voltage characteristics of the semiconductor device according to Embodiment 1.
Figure 14:
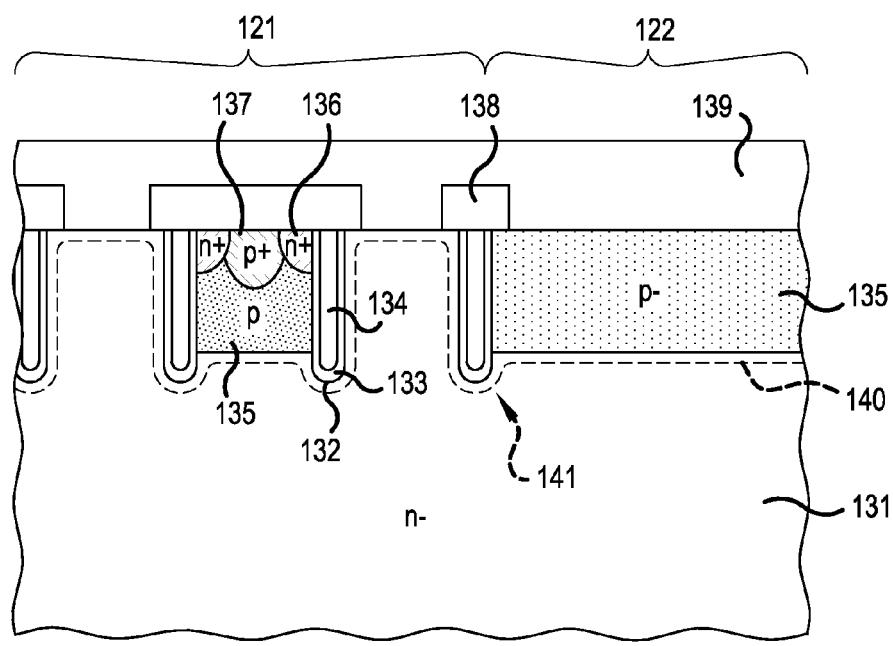
FIG. 14 is a sectional view showing the configuration of a semiconductor device of a comparison example.

Next, the breakdown voltage characteristics of the semiconductor device according to Embodiment 1 are verified. FIG. 13 is a characteristic diagram showing the breakdown voltage characteristics of the semiconductor device according to Embodiment 1. FIG. 14 is a sectional view showing the configuration of a semiconductor device of a comparison example. Firstly, the RC-IGBT shown in FIGS. 1 to 3 (hereafter referred to as the embodiment) is fabricated in accordance with the semiconductor device manufacturing method according to Embodiment 1. The RC-IGBT shown in FIG. 14 (hereafter referred to as the comparison example), with a configuration wherein no MOS gate is provided in FWD region 122, is fabricated as a comparison.

The comparison example is such that a trench gate type MOS gate formed of trench 132, gate dielectric 133, gate electrode 134, p-type channel region 135, n⁺ type emitter region 136, and p⁺ type body region 137 is provided in IGBT region 121 only. P-type channel region 135 functioning as a p-type anode region is provided over the whole of the front surface of an n⁻ type semiconductor substrate, which forms n⁻ type drift region 131, in FWD region 122. Reference signs 138 and 139 in FIG. 14 are an interlayer dielectric and an emitter electrode.

As a result of measuring the breakdown voltages of the embodiment and comparison example, it is confirmed that the breakdown voltage of the comparison example is in the region of 50V lower than the breakdown voltage of the embodiment, as shown in FIG. 13. The reason for this is as follows. When the IGBT is turned off and a high voltage is applied between the collector and emitter, a depletion layer 140 spreads from the p-n junction between p-type channel region 135 and n⁻ type drift region 131, because of which an electrical field concentrates in a bottom surface vicinity 141 of trench 132 closest to FWD region 122 side. Because of this, the breakdown voltage in the bottom surface vicinity 141 of the trench 132 closest to FWD region 122 side decreases, and the breakdown voltage of the whole comparison example also decreases.

This kind of problem occurs when p-type channel region 135 is provided over the whole of the front surface of the n⁻ type semiconductor substrate in FWD region 122, regardless of the configuration of the trench gate type IGBT formed in IGBT region 121. From the results shown in FIG. 13, it is confirmed that, by a trench gate formed of trench 2, gate dielectric 3, and gate electrode 4 being provided in FWD region 22 too, as in the case of the embodiment, it is possible to avoid a decrease in breakdown voltage at the boundary between IGBT region 21 and FWD region 22, and thus possible to improve the breakdown voltage characteristics of the RC-IGBT.

As heretofore described, according to Embodiment 1, it is possible to suppress an implantation of carriers when the FWD is operating by p⁻ type spacer regions being provided in the FWD region, and by there being less p-type channel regions in the FWD region than in the IGBT region. Because of this, an RC-IGBT wherein an IGBT and FWD are formed on the same n⁻ type semiconductor substrate is such that it is possible to reduce recovery loss when the FWD is operating. Also, by there being more p-type channel regions in the IGBT region than in the FWD region, it is possible to increase the IGBT channel density, and thus possible to reduce IGBT power loss (DC loss). Because of this, an RC-IGBT wherein an IGBT and FWD are formed on the same n⁻ type semiconductor substrate is such that it is possible for the on-state voltage (Von) characteristics of the IGBT to be approximately the same as the on-state voltage characteristics of a single IGBT (a device wherein only an IGBT is formed on an n⁻ type semiconductor substrate). Consequently, an RC-IGBT wherein an IGBT and FWD are formed on the same semiconductor substrate is such that it is possible for the electrical characteristics of both the IGBT and FWD to be in an optimal condition.

Also, according to Embodiment 1, it is possible, by providing a trench gate in the FWD region, to prevent a decrease in breakdown voltage in the vicinity of the boundary between the IGBT region and FWD region, and thus possible to maintain the breakdown voltage of the whole RC-IGBT. Also, by providing a MOS gate in the FWD region, it is possible to suppress a decrease in the channel density of the IGBT region, and possible to suppress a depreciation in the on-state voltage of the IGBT caused by the FWD being formed on the same n⁻ type semiconductor substrate. Consequently, optimal electrical characteristics are obtained in both the IGBT of the IGBT region and the FWD of the FWD region.

Embodiment 2

Figure 15:
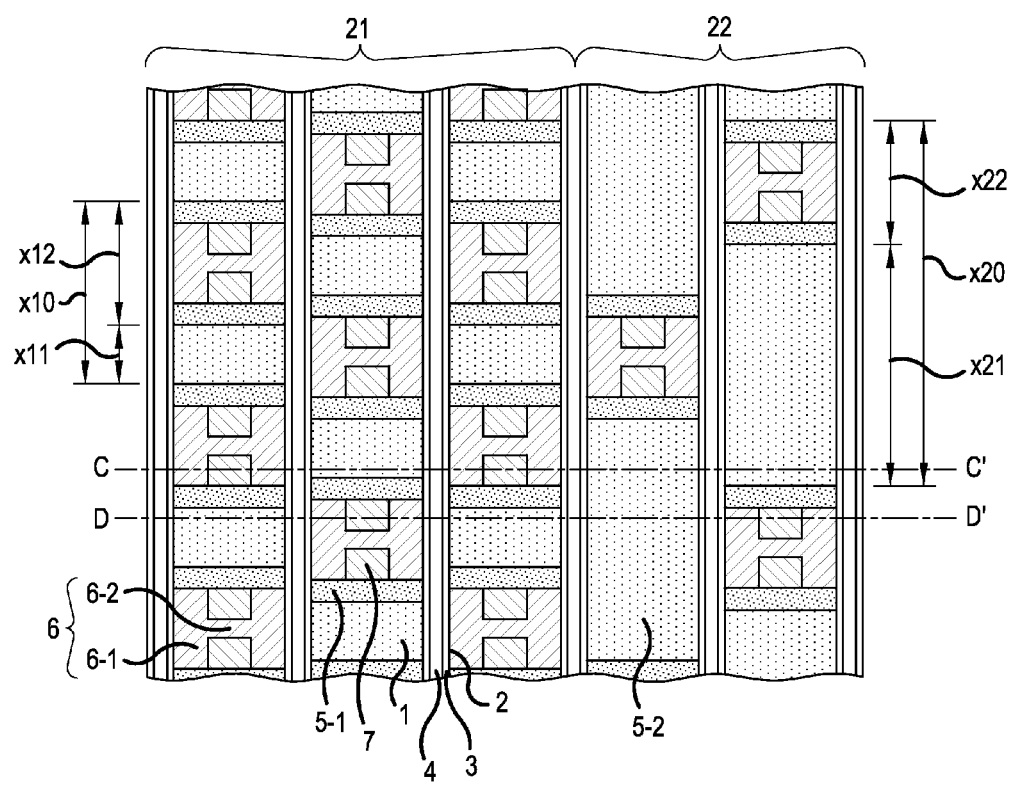
FIG. 15 is a plan view showing a configuration of a semiconductor device according to Embodiment 2.
Figure 16:
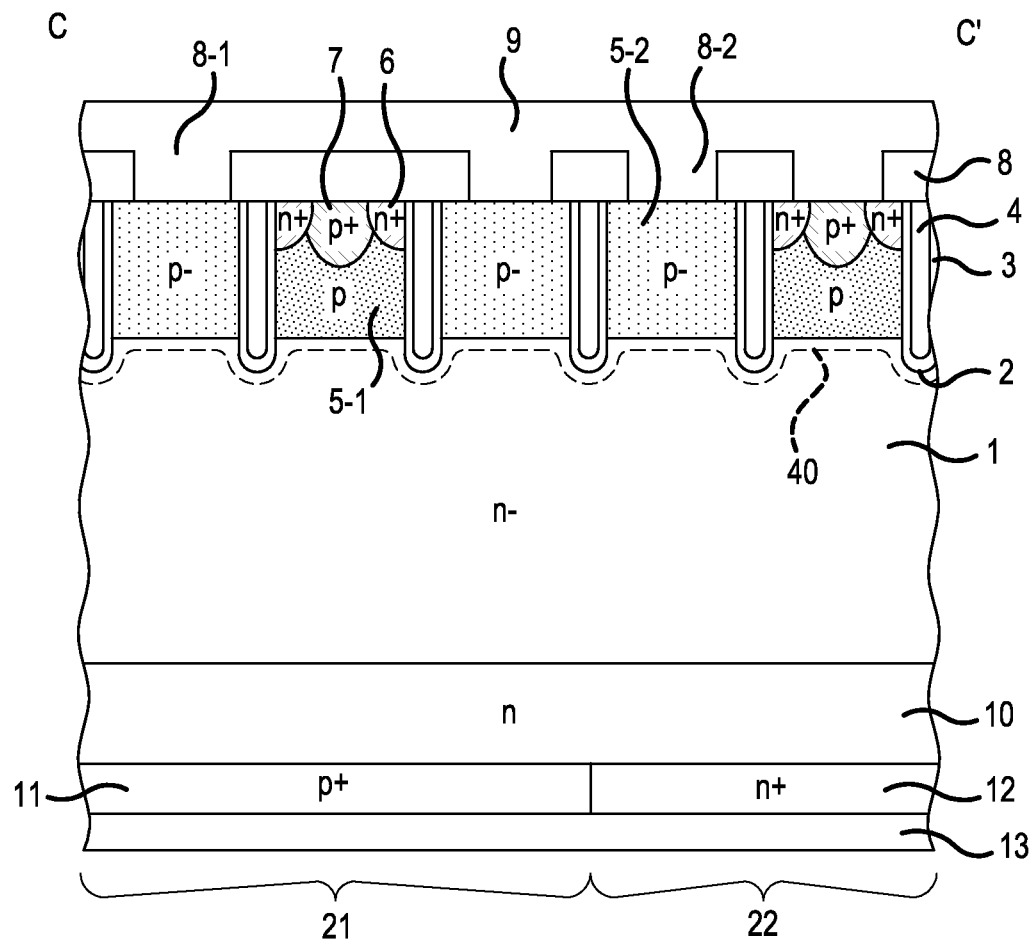
FIG. 16 is a sectional view showing a sectional structure along a cut line C-C' of FIG. 15.
Figure 17:
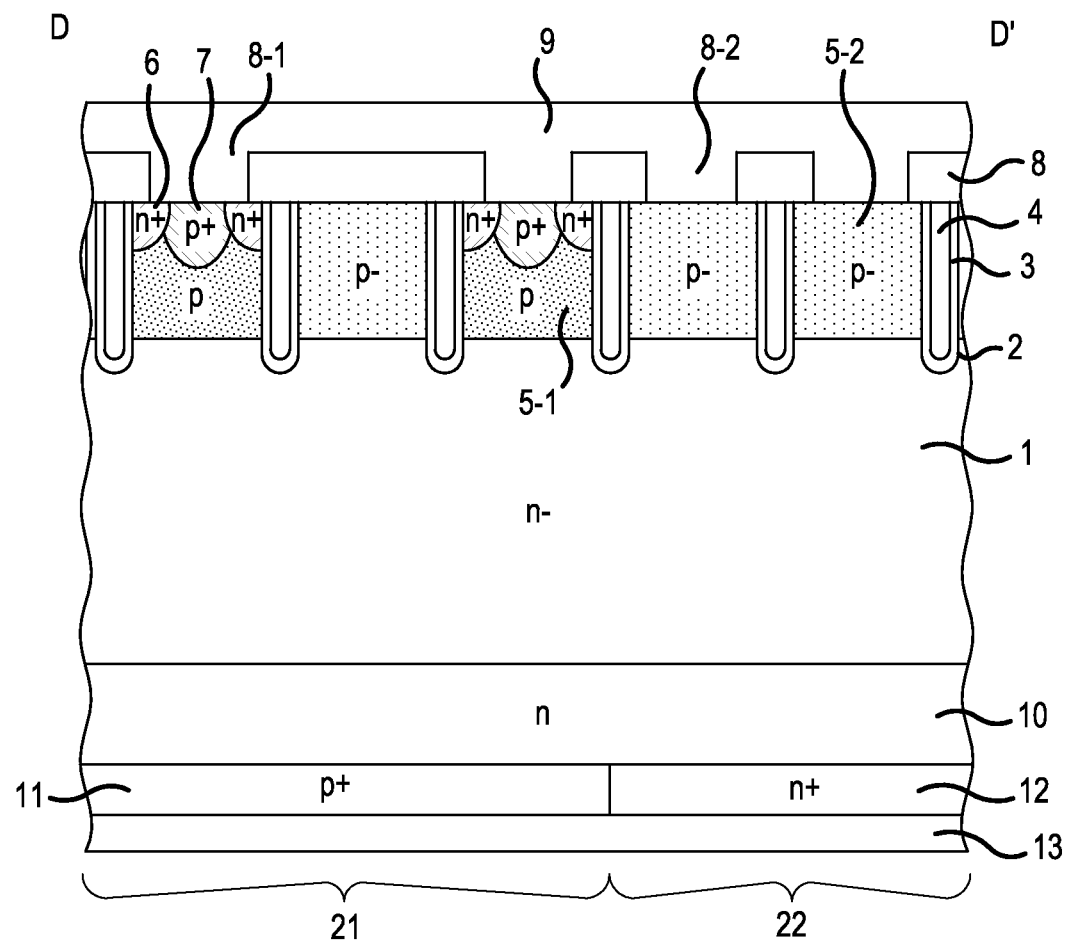
FIG. 17 is a sectional view showing a sectional structure along a cut line D-D' of FIG. 15.
Figure 18:
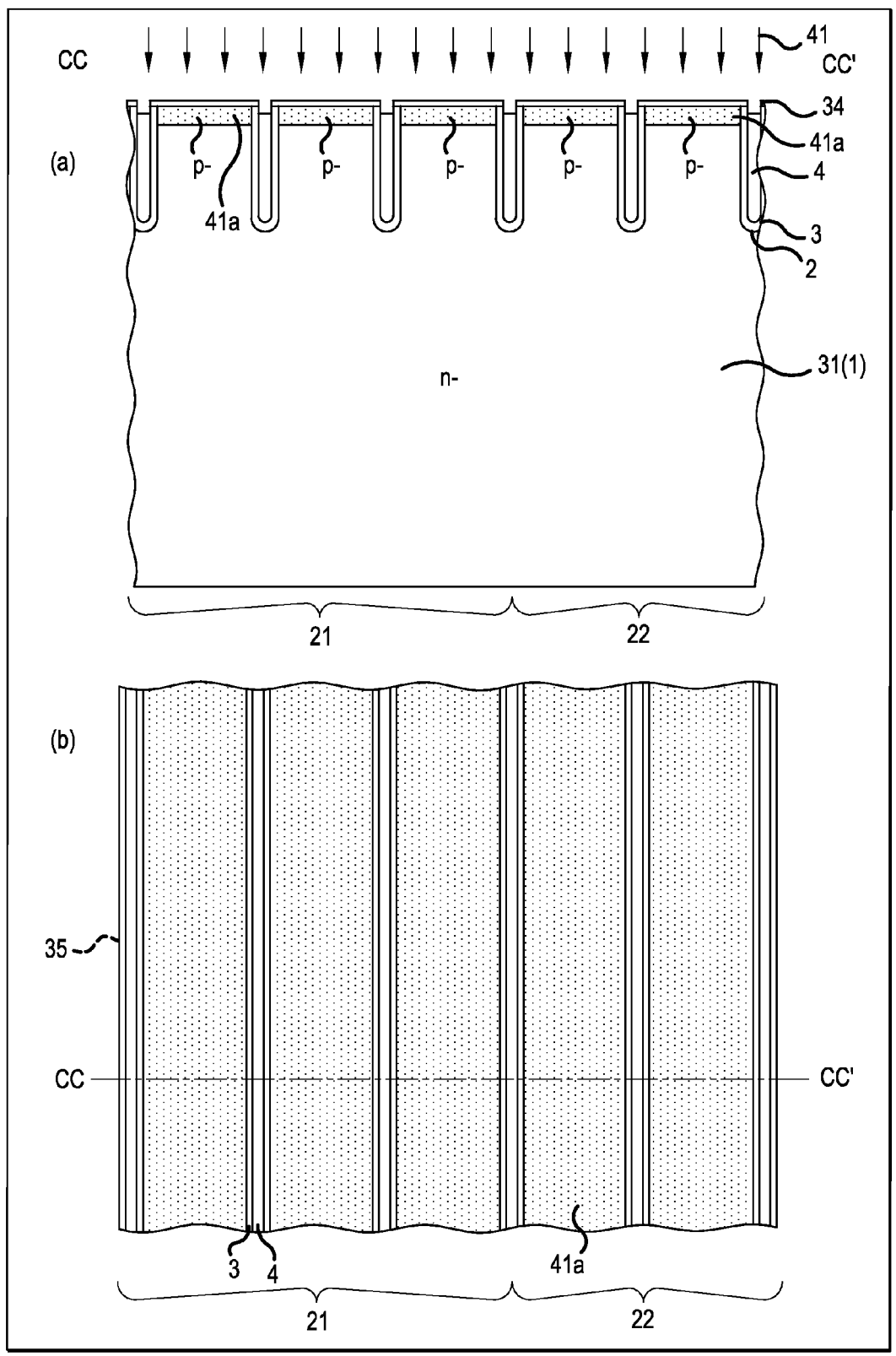
FIGS. 18A and 18B are illustrations showing a condition partway through the manufacturing of the semiconductor device according to Embodiment 2.
Figure 19:
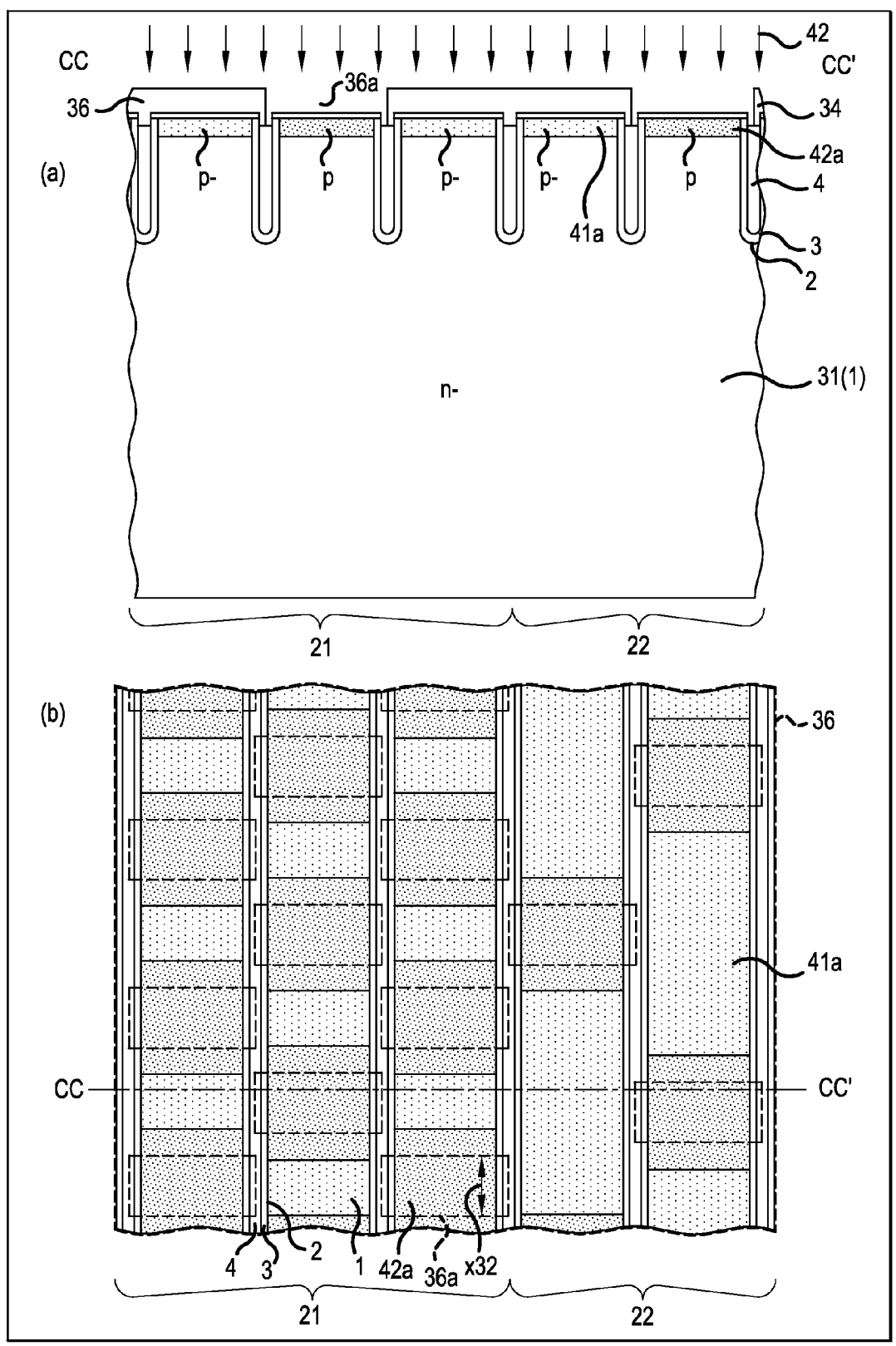
FIGS. 19A and 19B are illustrations showing a condition partway through the manufacturing of the semiconductor device according to Embodiment 2.
Figure 20:
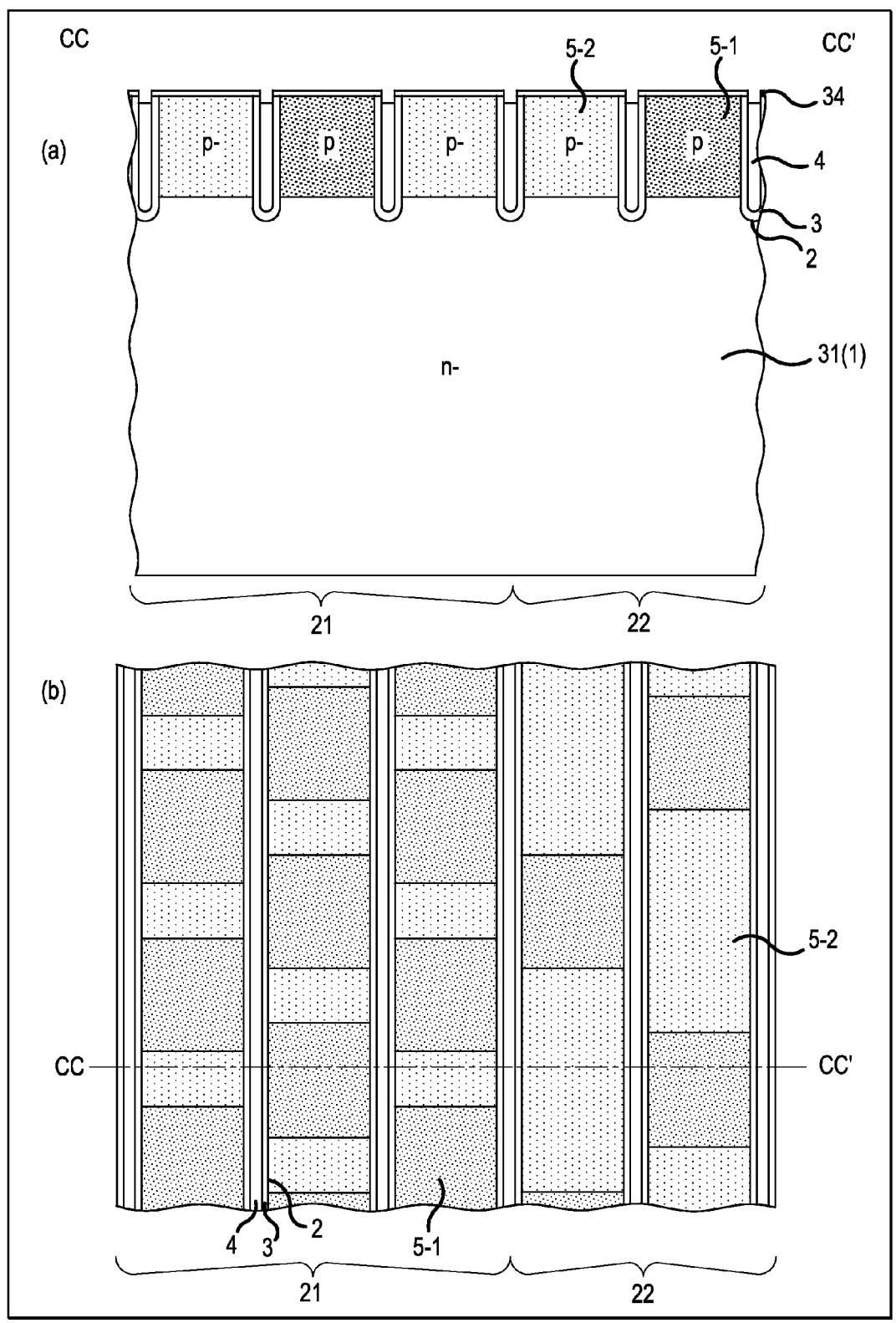
FIGS. 20A and 20B are illustrations showing a condition partway through the manufacturing of the semiconductor device according to Embodiment 2.
Figure 21:
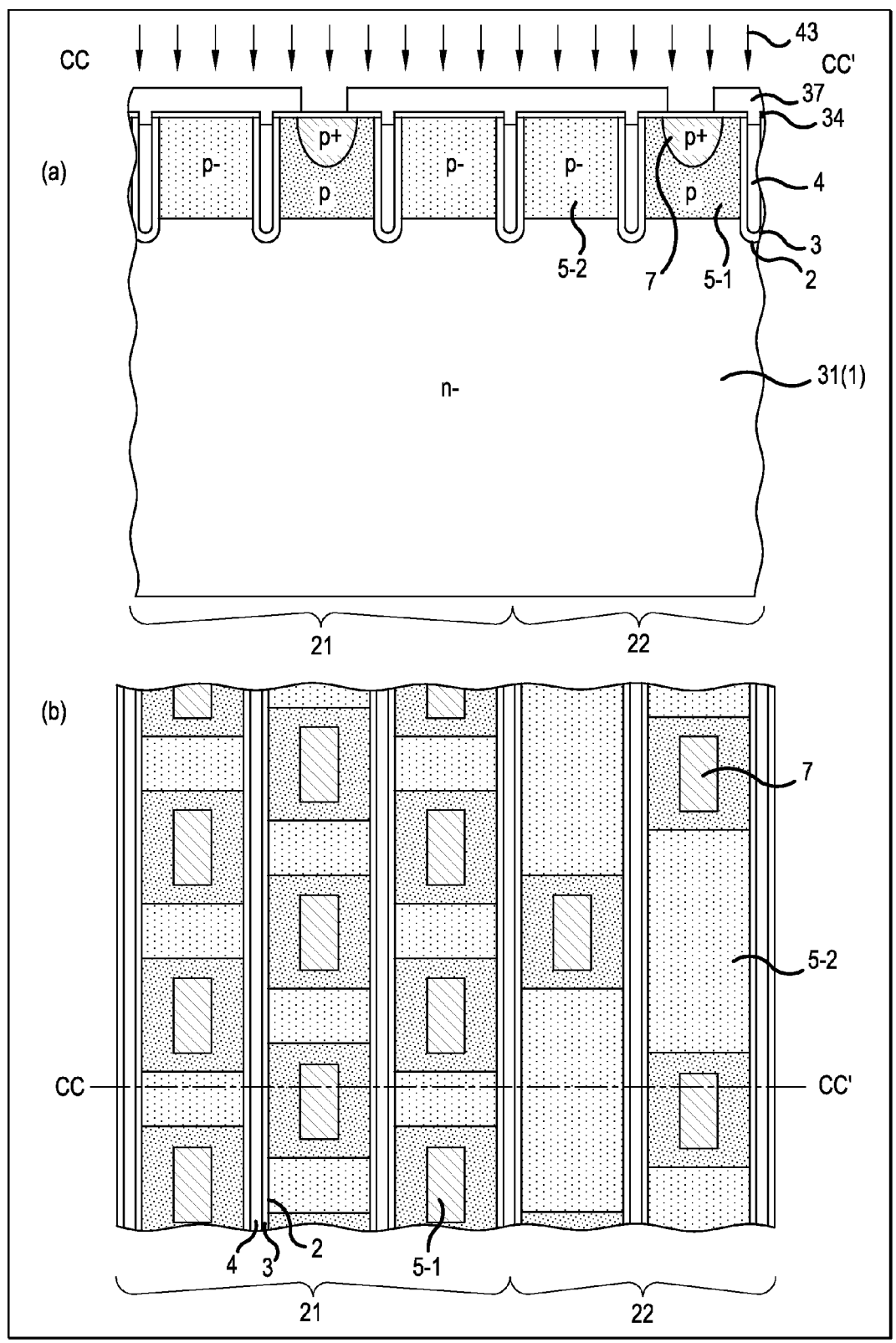
FIGS. 21A and 21B are illustrations showing a condition partway through the manufacturing of the semiconductor device according to Embodiment 2.
Figure 22:
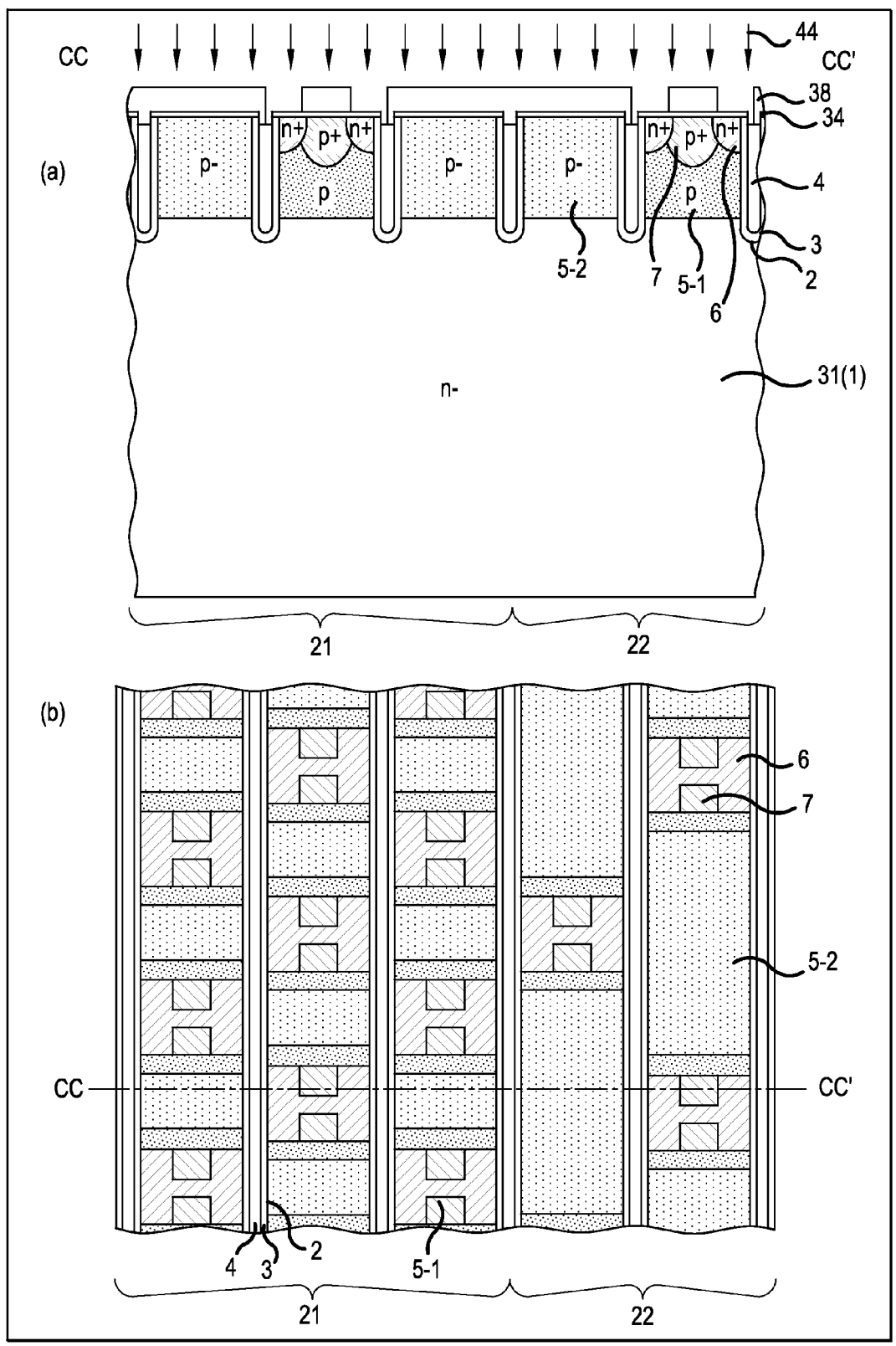
FIGS. 22A and 22B are illustrations showing a condition partway through the manufacturing of the semiconductor device according to Embodiment 2.

A description will be given of a semiconductor device according to Embodiment 2. FIG. 15 is a plan view showing a configuration of the semiconductor device according to Embodiment 2. FIG. 16 is a sectional view showing a sectional structure along a cut line C-C' of FIG. 15. FIG. 17 is a sectional view showing a sectional structure along a cut line D-D' of FIG. 15. The semiconductor device according to Embodiment 2 is different from the semiconductor device according to Embodiment 1 in that the p⁻ type spacer region 5-2 is provided between MOS gates neighboring in the longitudinal direction of trench 2 in IGBT region 21 too.

As shown in FIGS. 15 to 17, the semiconductor device according to Embodiment 2 is of a configuration wherein the p-type channel region 5-1 and p⁻ type spacer region 5-2 are alternately exposed on the front surface of the n⁻ type semiconductor substrate in both IGBT region 21 and FWD region 22. The spacing rate in FWD region 22 is higher than the spacing rate in IGBT region 21, in the same way as in Embodiment 1. The spacing rate in IGBT region 21 is the ratio between the surface area occupied by the p⁻ type spacer region 5-2 sandwiched between one MOS gate and another MOS gate neighboring the MOS gate and the surface area occupied by the relevant MOS gates. Configurations of the semiconductor device according to Embodiment 2 other than this are the same as in the case of the semiconductor device according to Embodiment 1.

By p⁻ type spacer region 5-2 being provided in IGBT region 21, a depletion layer 40 spreading from the p-n junction between p-type channel region 5-1 and n⁻ type drift region 1 when the IGBT is turned off and a high voltage is applied between the collector and emitter spreads along the p-n junction between the p⁻ type spacer region 5-2 and n⁻ type drift region 1. Because of this, depletion layer 40 spreads in a portion in which no MOS gate is provided at practically the same depth as in a portion in which MOS gates are provided, it is possible to arrange that the spread of depletion layer 40 is practically even from IGBT region 21 to FWD region 22, and portions in which the electrical field is locally high are eliminated.

Next, a description will be given of a semiconductor device manufacturing method according to Embodiment 2. FIGS. 18A to 22B are illustrations showing conditions partway through the manufacturing of the semiconductor device according to Embodiment 2. In FIGS. 18A to 22B, planar structures partway through the manufacturing are shown in FIGS. 18B, 19B, 20B, 21B, and 22B, while sectional structures along a cut line CC-CC' of FIGS. 18B, 19B, 20B, 21B, and 22B are shown in FIGS. 18A, 19A, 20A, 21A, and 22A. Firstly, in the same way as in Embodiment 1, n⁻ type semiconductor substrate 31 is prepared, and a trench gate formed of a voltage withstanding front surface element structure, trench 2, gate dielectric 3, and gate electrode 4 is formed, as shown in FIGS. 4 to 7.

Next, as shown in FIGS. 18A and 18B, screen oxide film 34 is formed by thermal oxidation technology on the front surface of n⁻ type semiconductor substrate 31. Screen oxide film 34 is omitted from FIG. 18B (the same applies to each of FIGS. 19B, 20B, 21B, and 22B). Next, first ion implantation 41 of a p-type impurity such as boron is carried out through the screen oxide film 34 into the whole of the front surface of n⁻ type semiconductor substrate 31. The conditions for first ion implantation 41 are the same as in Embodiment 1. P⁻ type impurity region 41a is formed by first ion implantation 41 in portions of n⁻ type semiconductor substrate 31 sandwiched by trenches 2 in IGBT region 21 and FWD region 22.

Next, in the same way as in Embodiment 1, p-type impurity region 42a is formed by carrying out second ion implantation 42 with resist mask 36 as a mask, after which a thermal diffusion process thermally diffusing p⁻ type impurity region 41a and p-type impurity region 42a is carried out, as shown in FIGS. 19A to 20B. By so doing, p-type channel region 5-1 is disposed in IGBT region 21 and FWD region 22 at the predetermined first and second pitches x11 and 21 respectively, and p-type channel region 5-1 and p⁻ type spacer region 5-2 are alternately exposed on the front surface of the n⁻ type semiconductor substrate.

Next, as shown in FIGS. 21A to 22B, p⁺ type body region 7 and n⁺ type emitter region 6 are selectively formed inside p-type channel region 5-1 by the third and fourth ion implantations 43 and 44, in the same way as in Embodiment 1. Subsequently, in the same way as in Embodiment 1, the RC-IGBT shown in FIGS. 15 to 17 is completed by the step of forming interlayer dielectric 8 over the whole of the front surface of n⁻ type semiconductor substrate 31, and subsequent steps, being carried out.

As heretofore described, according to Embodiment 2, it is possible to obtain the same advantages as with Embodiment 1. Also, according to Embodiment 2, it is possible, by providing a p⁻ type spacer region in the IGBT region, to arrange that the spread of the depletion layer spreading from the p-n junction between the p-type channel region and n⁻ type drift region when turning off is practically even from the IGBT region to the FWD region. By so doing, portions in the IGBT region in which the electrical field is locally high are eliminated, and it is thus possible to avoid destruction being caused by breakdown. Also, according to Embodiment 2, it is possible to reduce mirror capacitance Cgc of the IGBT by providing a p⁻ type spacer region in the IGBT region, and thus possible to improve the switching characteristics of the IGBT. Also, according to Embodiment 2, it is possible to increase the breakdown voltage of the IGBT by not connecting the p⁻ type spacer region of the IGBT region to the emitter electrode.

Embodiment 3

Figure 23:
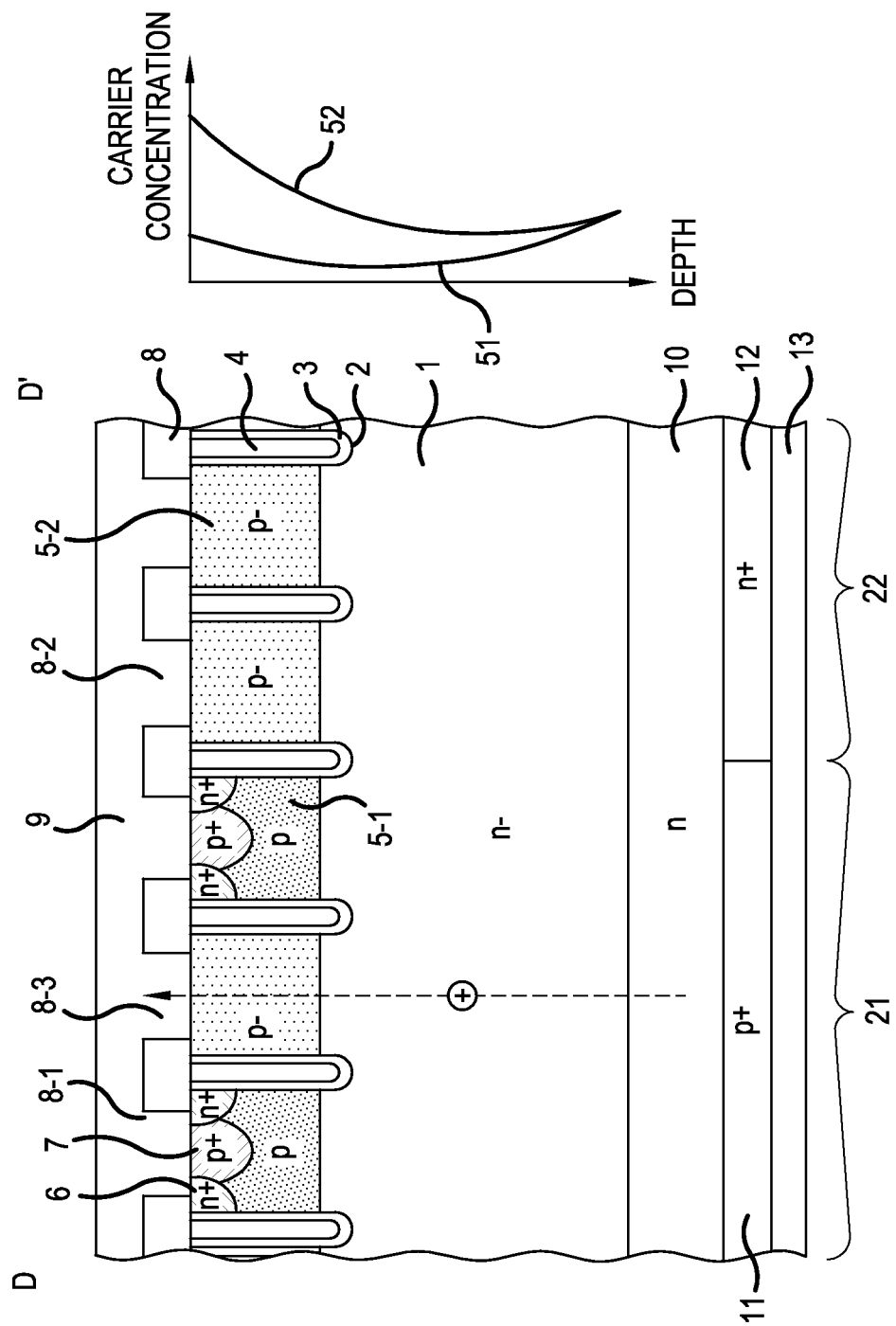
FIG. 23 is a sectional view showing a configuration of a semiconductor device according to Embodiment 3.

A description will be given of a semiconductor device according to Embodiment 3. FIG. 23 is a plan view showing a configuration of the semiconductor device according to Embodiment 3. FIG. 23 is the same as a sectional structure along a cut line D-D' of FIG. 15. The semiconductor device according to Embodiment 3 is different from the semiconductor device according to Embodiment 2 in that the p⁻ type spacer region 5-2 is connected to the emitter electrode 9 in IGBT region 21 too.

As shown in FIG. 23, the semiconductor device according to Embodiment 3 is such that p⁻ type spacer region 5-2 provided in IGBT region 21 is connected to emitter electrode 9 via third contact hole 8-3. First contact hole 8-1 in which n⁺ type emitter region 6 and p⁺ type body region 7 are exposed and third contact hole 8-3 in which p⁻ type spacer region 5-2 is exposed may be provided separately in each cell portion, or may be provided as one contact hole provided in the longitudinal direction of trench 2, in the same way as second contact hole 8-2 of FWD region 22.

By p⁻ type spacer region 5-2 of IGBT region 21 being connected to emitter electrode 9, holes in n⁻ type drift region 1 are drawn out from p⁻ type spacer region 5-2 via third contact hole 8-3 to emitter electrode 9 when the IGBT is turned off (the path of the holes is shown by the dotted line in FIG. 23). Because of this, it is possible for carrier concentration 51 in IGBT region 21 to be lower than carrier concentration 52 of the semiconductor device according to Embodiment 2 (an RC-IGBT of a configuration wherein p⁻ type spacer region 5-2 of IGBT region 21 is not connected to emitter electrode 9), as shown in the characteristic diagram on the right side of FIG. 23. Although the on-state voltage of the IGBT increases owing to p⁻ type spacer region 5-2 of IGBT region 21 being connected to emitter electrode 9, this can be avoided by the channel density being increased.

Configurations other than this of the semiconductor device according to Embodiment 3 are the same as in the case of the semiconductor device according to Embodiment 2. The semiconductor device manufacturing method according to Embodiment 3 is such that it is sufficient when forming the first contact holes in interlayer dielectric 8 of IGBT region 21 using the semiconductor device manufacturing method according to Embodiment 2 that one first contact hole 8-1 is formed in the longitudinal direction of trench 2 between each pair of neighboring trenches 2.

As heretofore described, according to Embodiment 3, it is possible to obtain the same advantages as with Embodiment 1. Also, according to Embodiment 3, in the same way as with Embodiment 2, portions in the IGBT region in which the electrical field is locally high are eliminated, and it is thus possible to avoid destruction being caused by breakdown. Also, according to Embodiment 3, it is possible to suppress an implantation of carriers from the p⁺ type body region, and to more quickly draw out carriers when the IGBT is turned off, by the p⁻ type spacer region of the IGBT region being connected to the emitter electrode. Because of this, the carrier concentration in the IGBT region decreases, it is possible to shorten the time for turning off the IGBT, and possible to reduce a turn-off loss Err of the IGBT.

Embodiment 4

Figure 24:
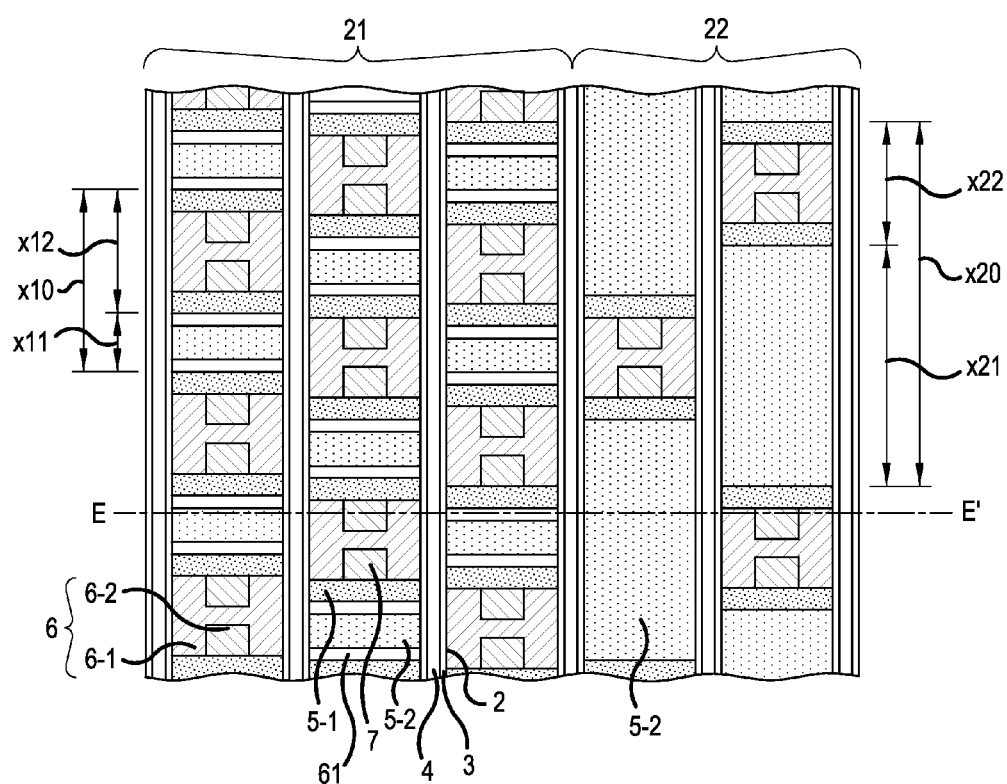
FIG. 24 is a plan view showing a configuration of a semiconductor device according to Embodiment 4.
Figure 25:
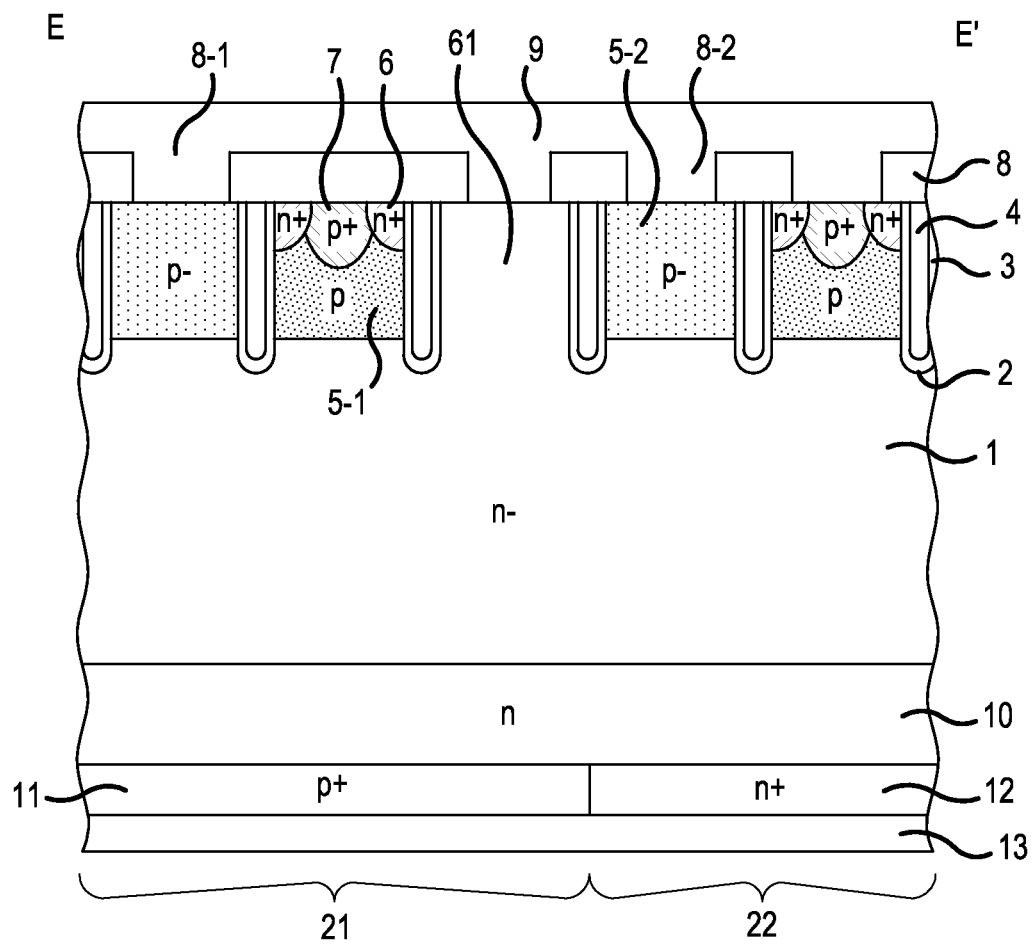
FIG. 25 is a sectional view showing a sectional structure along a cut line E-E' of FIG. 24.
Figure 26:
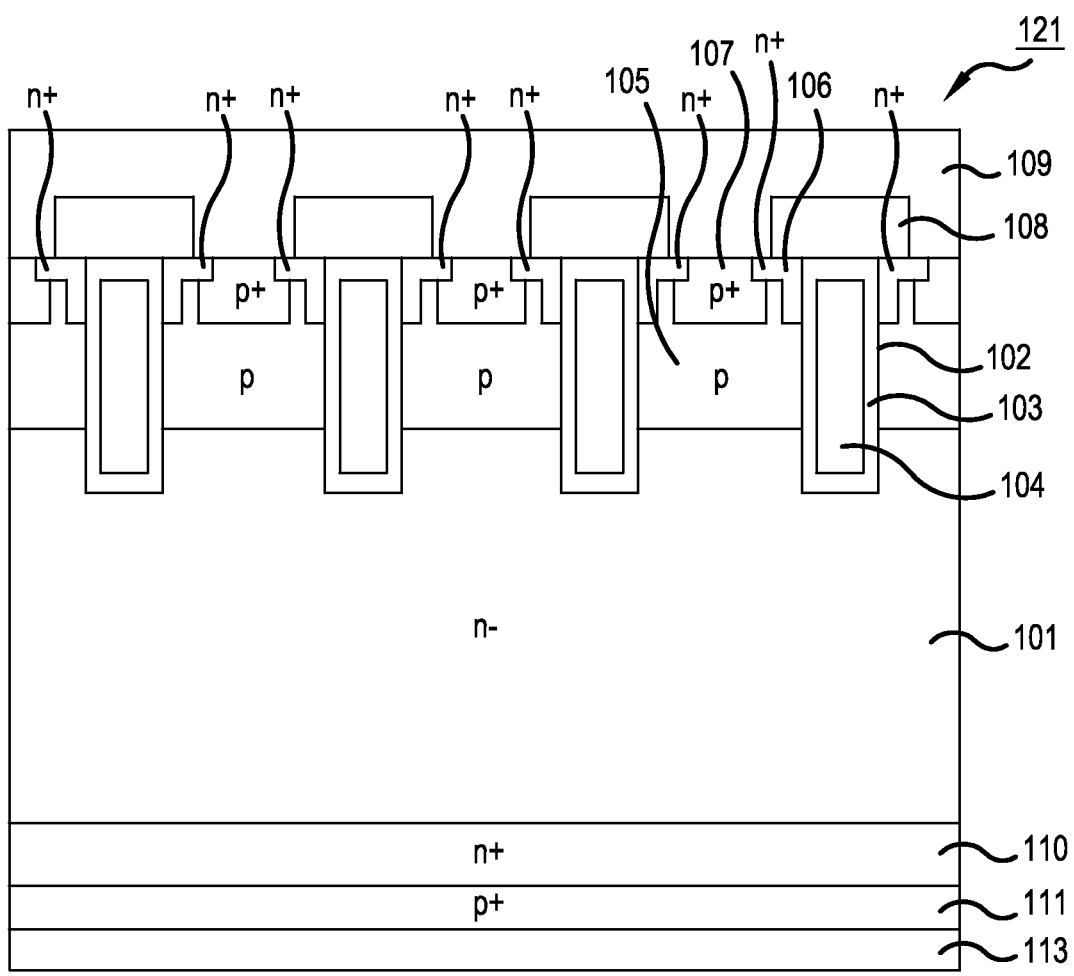
FIG. 26 is a sectional view showing a configuration of a heretofore known vertical semiconductor device with a trench gate structure.
Figure 27:
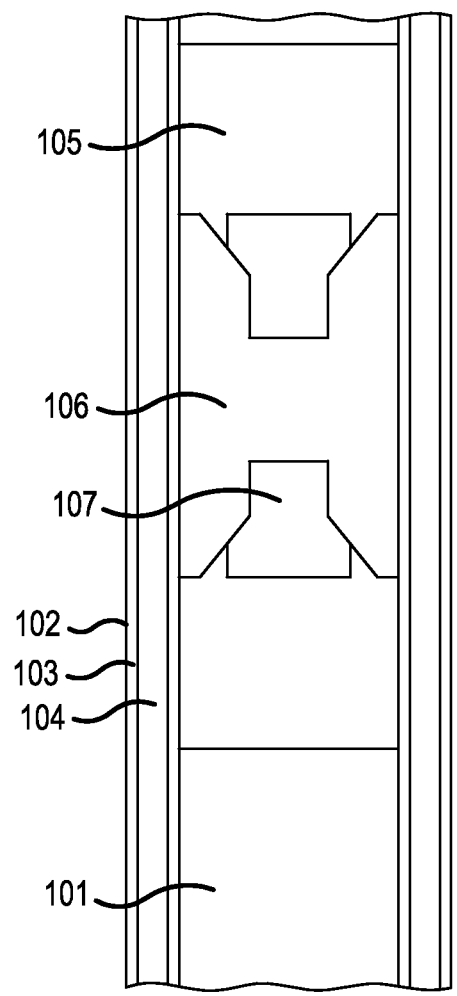
FIG. 27 is a plan view showing an enlargement of a planar structure of a cell portion of the vertical semiconductor device of FIG. 26.

A description will be given of a semiconductor device according to Embodiment 4. FIG. 24 is a plan view showing a configuration of the semiconductor device according to Embodiment 4. FIG. 25 is a sectional view showing a sectional structure along a cut line E-E' of FIG. 24. The semiconductor device according to Embodiment 4 is different from the semiconductor device according to Embodiment 2 in that an n⁻ type region (a first conductivity type semiconductor region) 61 is provided between p-type channel regions 5-1 and p⁻ type spacer regions 5-2 neighboring in the longitudinal direction of trench 2 in IGBT region 21.

As shown in FIGS. 24 and 25, the semiconductor device according to Embodiment 4 is of a configuration wherein n⁻ type region 61 is provided between p-type channel region 5-1 and p⁻ type spacer region 5-2 in IGBT region 21, and p⁻ type spacer region 5-2 and p-type channel region 5-1 are not in contact. That is, n⁻ type region 61 is exposed between p-type channel region 5-1 and p⁻ type spacer region 5-2 alternately exposed on the front surface of the n⁻ type semiconductor substrate in IGBT region 21. N⁻ type region 61 is not in contact with emitter electrode 9.

Configurations other than this of the semiconductor device according to Embodiment 4 are the same as in the case of the semiconductor device according to Embodiment 1. The semiconductor device manufacturing method according to Embodiment 4 is such that, using the semiconductor device manufacturing method according to Embodiment 2, p⁻ type spacer region 5-2 may be formed so that n⁻ type drift region 1 that is to form n⁻ type region 61 remains between p-type channel region 5-1 of IGBT region 21 and p⁻ type spacer region 5-2, or an n-type impurity may be ion implanted into the front surface of the n⁻ type semiconductor substrate, and n⁻ type region 61 formed inside p⁻ type spacer region 5-2 to a depth reaching n⁻ type drift region 1.

As heretofore described, according to Embodiment 4, it is possible to obtain the same advantages as with Embodiment 1. Also, according to Embodiment 4, it is possible, by the n⁻ type region being provided between the p-type channel region and p⁻ type spacer region in the IGBT region, to increase the electron injection enhancement (IE) effect by accumulating carriers in the p⁻ type spacer region when the IGBT carries out a turning-on action, and thus possible to reduce DC loss. Also, according to Embodiment 4, the n⁻ type region is provided between the p-type channel region and p⁻ type spacer region in the IGBT region, because of which a depletion layer spreading from the p-n junction between the p-type channel region and n⁻ type region and a depletion layer spreading from the p-n junction between the p⁻ type spacer region and n⁻ type region meet when the IGBT is turned off and a high voltage is applied between the collector and emitter. Because of this, it is possible to quicken the drawing of carriers to the emitter electrode.

The invention not being limited to the heretofore described inventions, various changes are possible without departing from the scope of the invention. For example, the invention may be of a configuration wherein no p-type channel region (MOS gate) is provided between the neighboring trenches in the FWD region closest to the IGBT region side, and only the p⁻ type spacer region is exposed on the front surface of the n⁻ type semiconductor substrate. Also, in each embodiment, the first conductivity type is taken to be the n-type and the second conductivity type the p-type, but the invention is also established in the same way when the first conductivity type is taken to be the p-type and the second conductivity type the n-type.

As heretofore described, the semiconductor device and semiconductor device manufacturing method according to the invention are useful in a power semiconductor device used in a power source instrument, or the like, in the field of power electronics.

What is claimed is:

1. A method of manufacturing a semiconductor device including on a first conductivity type semiconductor substrate a first element region in which is provided an insulated gate bipolar transistor and a second element region in which is provided a diode, the method comprising:
   a step of forming a plurality of trenches provided at predetermined intervals from the first element region to the second element region in the front surface of the first conductivity type semiconductor substrate, in stripe form extending in a longitudinal direction perpendicular to the direction in which the first element region and second element region are aligned;
   a step of forming a gate electrode across a gate dielectric inside the trench;
   a step of forming a second conductivity type spacer region at least between neighboring trenches of the second element region; and
   a step of selectively forming second conductivity type channel regions with an impurity concentration higher than that of the second conductivity type spacer region at predetermined intervals in the longitudinal direction of the trench between neighboring trenches; wherein
   the second conductivity type channel region formed inside the second conductivity type spacer region is disposed alternately with the second conductivity type spacer region in the longitudinal direction of the trench, and
   the disposition interval in the longitudinal direction of the trench of the second conductivity type channel region in the first element region is shorter than the disposition interval in the longitudinal direction of the trench of the second conductivity type channel region in the second element region.

2. The semiconductor device manufacturing method according to claim 1, wherein the second conductivity type spacer region is formed only in the second element region.

3. The semiconductor device manufacturing method according to claim 1, wherein the second conductivity type channel region is formed in contact with the second conductivity type spacer region.

4. The semiconductor device manufacturing method according to claim 1, further comprising:
   a step of selectively forming a first conductivity type emitter region inside the second conductivity type channel region;
   a step of covering the front surface of the first conductivity type semiconductor substrate with an interlayer dielectric;
   a step of forming contact holes, selectively opened in the interlayer dielectric, in which the second conductivity type channel region, first conductivity type emitter region, and second conductivity type spacer region are selectively exposed; and
   a step of forming a first electrode in contact with the second conductivity type channel region, first conductivity type emitter region, and second conductivity type spacer region via the contact holes,
   wherein the contact holes formed in the second element region are formed so that the second conductivity type channel region and second conductivity type spacer region are exposed alternately along the trench in the longitudinal direction of the trench.

5. The semiconductor device manufacturing method according to claim 1, wherein the second conductivity type spacer region is formed in the first element region and second element region.

6. The semiconductor device manufacturing method according to claim 5, wherein the second conductivity type channel region and second conductivity type spacer region are separately disposed in the first element region, and a first conductivity type semiconductor region is formed between the second conductivity type channel region and second conductivity type spacer region.

7. A semiconductor device including on a first conductivity type semiconductor substrate a first element region having an insulated gate bipolar transistor and a second element region having a diode, the device comprising:
   a plurality of trenches provided in stripe form in the front surface of the first conductivity type semiconductor substrate at predetermined intervals between the first element region and the second element region, the trenches extending in a longitudinal direction perpendicular to the direction in which the first element region and second element region are aligned;
   a gate dielectric provided along the side walls and bottom surface of the trench;
   a gate electrode provided on the inner side of the gate dielectric inside the trench;
   second conductivity type channel regions provided at predetermined intervals in the longitudinal direction of the trench between neighboring trenches;
   a first conductivity type emitter region, selectively provided inside the second conductivity type channel region, in contact with the gate dielectric provided on the side walls of the trench;
   a second conductivity type spacer region with an impurity concentration lower than that of the second conductivity type channel region, disposed alternately with the second conductivity type channel region in the longitudinal direction of the trench between neighboring trenches of the second element region;
   a first electrode in contact with the second conductivity type channel region, first conductivity type emitter region, and second conductivity type spacer region;
   a second conductivity type collector layer provided on the back surface of the first conductivity type semiconductor substrate in the first element region;
   a first conductivity type cathode layer provided on the back surface of the first conductivity type semiconductor substrate in the second element region; and
   a second electrode in contact with the second conductivity type collector layer and first conductivity type cathode layer, wherein
   the disposition interval in the longitudinal direction of the trench of the second conductivity type channel region in the first element region is shorter than the disposition interval in the longitudinal direction of the trench of the second conductivity type channel region in the second element region.

8. The semiconductor device according to claim 1, further comprising:
   an interlayer dielectric covering the front surface of the first conductivity type semiconductor substrate; and
   contact holes selectively opened in the interlayer dielectric so that portions of the second conductivity type channel region, first conductivity type emitter region, and second conductivity type spacer region in contact with the first electrode are exposed, wherein the contact holes formed in the second element region expose the second conductivity type channel region and second conductivity type spacer region alternately along the trench in the longitudinal direction of the trench.

9. The semiconductor device according to claim 7, wherein the second conductivity type spacer region is further provided in portions of the first element region sandwiched by the second conductivity type channel region between neighboring trenches.

10. The semiconductor device according to claim 9, further comprising a first conductivity type semiconductor region provided between the second conductivity type spacer region of the first element region and the second conductivity type channel region neighboring the second conductivity type spacer region in the longitudinal direction of the trench.

11. The semiconductor device according to claim 9, wherein the second conductivity type spacer region of the first element region is in contact with the second conductivity type channel region neighboring in the longitudinal direction of the trench.

12. The semiconductor device according to claim 11, wherein the first electrode is further in contact with the second conductivity type spacer region disposed in the first element region.

* * * * *